US007042216B2

(12) United States Patent
Barbic

(10) Patent No.: US 7,042,216 B2
(45) Date of Patent: May 9, 2006

(54) TWO-DIMENSIONAL MAGNETIC RESONANCE TOMOGRAPHIC MICROSCOPY

(75) Inventor: Mladen Barbic, San Gabriel, CA (US)

(73) Assignee: California Institute of Technology, Pasedena, CA (US)

( * ) Notice: Subject to any disclaimer, the term of this patent is extended or adjusted under 35 U.S.C. 154(b) by 5 days.

(21) Appl. No.: 10/849,764

(22) Filed: May 20, 2004

(65) Prior Publication Data

US 2004/0232914 A1    Nov. 25, 2004

Related U.S. Application Data

(60) Provisional application No. 60/471,803, filed on May 20, 2003.

(51) Int. Cl.
*G01V 3/00*    (2006.01)

(52) U.S. Cl. ........................ 324/307; 324/309

(58) Field of Classification Search ........... 324/307, 324/309, 312, 318, 319, 322, 300
See application file for complete search history.

(56) References Cited

U.S. PATENT DOCUMENTS

| 5,406,479 | A * | 4/1995 | Harman ................... 378/7 |
| 5,619,139 | A * | 4/1997 | Holczer et al. ........... 324/318 |
| 6,377,048 | B1 * | 4/2002 | Golan et al. ............. 324/318 |
| 6,653,832 | B1 * | 11/2003 | Wind et al. .............. 324/307 |
| 6,670,811 | B1 * | 12/2003 | Wind et al. .............. 324/307 |
| 6,836,115 | B1 * | 12/2004 | Wind et al. .............. 324/307 |
| 6,897,654 | B1 * | 5/2005 | Barbic .................... 324/307 |

OTHER PUBLICATIONS

P. C. Lauterbur, Image Formation By Induced Local Interactions: Examples Employing Nuclear Magnetic Resonance, Nature (London) 242-243, 190 (1973).
P. Mansfield et al., NMR 'Diffraction' in Solids?, J. Phys. C 6, L422-1426, (1973).
J. Aguayo et al., Nuclear Magnetic Resonance Imaging of a Single Cell, Nature (London) 322, 190-191, (1986).
S. C. Lee et al., Communications: One Micrometer Resolution NMR Microscopy, J. Magn. Reson. 150, 207-213, (2001).
P. Mansfield et al., "Diffraction" and Microscopy in Solids and Liquids by NMR, Phys. Rev. B 12, 3618-3634 (1975).
J. A. Sidles, Noninductive Detection of Single-Proton Magnetic Resonance, Appl. Phys. Lett. 58, 2854-2856, (1991).

(Continued)

*Primary Examiner*—Brij B. Shrivastav
(74) *Attorney, Agent, or Firm*—Gates & Cooper LLP

(57) ABSTRACT

A method, apparatus, and article of manufacture provide the ability to conduct magnetic resonance tomographic microscopy. A two-dimensional non-crystalline sample is placed under the influence of a static polarizing first magnetic field. A radio-frequency field is then introduced perpendicular to the first magnetic field. To conduct the tomography, two or more magnetically resonant spins of the sample are simultaneously obtained by sequentially angularly rotating, around a prescribed axis, the sample with respect to a ferromagnetic sphere having a second magnetic field. The obtained spins are then used to reconstruct an image of the sample using computerized tomography.

20 Claims, 14 Drawing Sheets

OTHER PUBLICATIONS

J. A. Sidles et al., Magnetic Resonance Force Microscopy, Rev. Mod. Phys. 67, 249-265 (1995).

D. Rugar et al. Mechanical Detection of Magnetic Resonance, Nature (London) 360, 563-566 (1992).

D. Rugar et al., Force Detection of Nuclear Magnetic Resonance, Science 264, 1560-1563, (1994).

Z. Zhang et al. Observation of Ferromagnetic Resonance in a Microscopic Sample Using Magnetic Resonance Force Microscopy, Appl. Phys. Lett. 68, 3-pp. 2005-2007, (1996).

K. Wago et al., Low-Temperature Magnetic Resonance Force Detection, J. Vac. Sci. Technol. B 14, 1197-1201, (1996).

K. J. Bruland et al., Force-Detected Magnetic Resonance in a Field Gradient of 250 000 Tesla per Meter, Appl. Phys. Lett. 73(21), 3159-3161, (1998).

B. C. Stipe et al., Magnetic Dissipation and Fluctuations in Individual Nanomagnets Measured by Ultrasensitive Cantilever Magnetometry, Phys. Rev. Lett. 86, 2874-2877, (2001).

T. D. Stowe et al., Attonewton Force Detection Using Ultrathin Silicon Cantilevers, Appl. Phys. Lett. 71, 288-290, (1997).

O. Zuger et al., First Images From a Magnetic Resonance Force Microscope Appl. Phys. Lett. 63, 2496-2498, (1993).

O. Zuger et al., Three-Dimensional Imaging with a Nuclear Magnetic Resonance Force Microscope, J. Appl. Phys. 79, 1881-1884, (1996).

M. Barbic, Magnetic Resonance Diffraction Using the Magnetic Field from a Ferromagnetic Sphere, J. Appl. Phys. 91, 9987-9994, (2002).

M. Barbic et al.Sample-Detector Coupling in Atomic Resolution Magnetic Resonance Diffraction, J. Appl. Phys. 92, 7345-7354, (2002).

P. Streckeisen et al., Instrumental Aspects of Magnetic Resonance Force Microscopy, Appl. Phys. A: Mater. Sci. Process. A66, S341-S344, (1998).

C. Petit, Self-Organization of Magnetic Nanosized Cobalt Particles**, Adv. Mater. (Weinheim, Ger.) 10, 259-261, (1998).

S. Sun et al., Monodisperse FePt Nanoparticles and Ferromagnetic FePt Nanocrystal Superlattices, Science 287, 1989-1992, (2000).

A. F. Puntes et al., Colloidal Nanocrystal Shape and Size Control: The Case of Cobalt, Science 291, 2115-2117, (2001).

T. Hyeon et al., Synthesis of Highly Crystalline and Monodisperse Maghemite Nanocrystallites Without a Size-Selection Process, J. Am. Chem. Soc. 123, 12798-12801, (2001).

D. R. Baselt et al., A High Sensitivity Micromachined Biosensor, Proc. IEEE 85, 672-680, (1997).

M. A. Lantz et al., High Resolution Eddy Current Microscopy, Appl. Phys. Lett. 78, 383-385 (2001).

T. Ono et al., Magnetic Force and Optical Force Sensing with Ultrathin Silicon Resonator, Rev. Sci. Instrum. 74, 5141-5146, (2003).

P. J. McDonald et al., Stray Field Magnetic Resonance Imaging, Rep. Prog. Phys. 61, 1441-1493, (1998).

D. I. Hoult et al., The Quantum Origins of The Free Induction Decay Signal and Spin Noise, J. Magn. Reson. 148, 182-199, (2001).

J. A. Sidles et al., The Classical and Quantum Theory of Thermal Magnetic Noise, with Applications in Spintronics and Quantum Microscopy, Proc. IEEE 91, 799-816, (2003).

J. D. Hannay et al., Thermal Field Fluctuations in a Magnetic TIP/Implications for Magnetic Resonance Force Microscopy, J. Appl. Phys. 87, 6827-6829, (2000).

L. R. Narasimhan et al., Squid Microsusceptometry in Applied Magnetic Fields, IEEE Trans. Appl. Supercond. 9, 3503-3506, (1999).

G. Boero et al.,Hall Detection of Magnetic Resonance, Appl. Phys. Lett. 79, 1498-1500, (2001).

R. D. Black et al., A High-Temperature Superconducting Receiver for Nuclear Magnetic Resonance Microscopy, Science 259, 793-795, (1993).

S. Zhang et al., High-Sensitivity Ferromagnetic Resonance Measurements on Micrometer-Sized Samples, Appl. Phys. Lett. 70, 2756-2758, (1997).

F. Bloch, Nuclear Induction, Phys. Rev. 70, 460-474, (1946).

J. G. Kempf et al., Nanoscale Fourier-Transform Imaging with Magnetic Resonance Force Microscopy, Phys. Rev. Lett. 90, 087601-4 (2003).

E. E. Sigmund et al., Hole-Burning Diffusion Measurements in High Magnetic Field Gradients, J. Magn. Reson. 163, 99-104, (2003).

G. Binning, H. Rohrer, Surface Studies by Scanning Tunneling Microscopy, Phys. Rev. Lett. 49, 57-61, (1982).

G. Binning, et al., Atomic Force Microscope, Phys. Rev. Lett. 56, 930-934, (1986).

R. Wiesendanger, Observation of Vacuum Tunneling of Spin-Polarized Electrons with the Scanning Tunneling Microscope, Phys. Rev. Lett. 65, 247-251, (1990).

Y. Manassen et al., Direct Observation of the Precession of Individual Paramagnetic Spins on Oxidized Silicon Surfaces, Phys. Rev. Lett. 62, 2531-2535, (1989).

C. Durkan et al., Electronic Spin Detection in Molecules Using Scanning-Tunneling-Microscopy-Assisted Electron-Spin Resonance, Appl. Phys. Lett. 80, 458-460, (2002).

J. Sanny et al., Microwave Electron Spin Resonantor Spectrometer with Operation to 54 Mk in a Dilution Refrigerator, *Rev. Sci. Instrum.* 52, 539-541, (1981).

H. Mahdjour et al., High-Sensitivity Broadband Microwave Spectroscopy with Small Nonresonant Coils, *Rev. Sci. Instrum.*, 57, 1100-1106, (1986).

D. L. Olson et al., High-Resolution Microcoil $^1$H-NMR for Mass-Limited, Nanoliter-Volume Samples, *Science* 270, 1967-1970, (1995).

D. A. Seeber et al., Triaxial Magnetic Field Gradient System for Microcoil Magnetic Resonance Imaging, *Rev. Sci. Instrum.* 71, 4263-4272 (2000).

L. Ciobanu et al., 3D MR Microscopy with Resolution 3.7um BY 3.3 um BY 3.3um, *J. Magn. Reson.* 158, 178-182, (2002).

M. Barbic et al., Electromagnetic Micromotor for Microfluidics Applications, *Appl. Phys. Lett.* 79:9, 1399-1401, (2001).

M. Barbic et al., Scanning Probe Electromagnetic Tweezers, *Appl. Phys. Lett.* 79:12, 1897-1899, (2001).

M. Barbic, Magnetic Wires in MEMS and Bio-Medical Applications, *J. Magn. Mag. Mater.* 249, 357-367, (2002).

M. Todorovic et al., Miniature High-Sensitivity Quartz Tuning Fork Alternating Gradient Magnetometry, *Appl. Phys. Lett.* 73, 3539-3597 (1998).

J. A. Rogers et al., Using Microcontact Printing to Fabricate Microcoils on Capillaries for High Resolution Proton Nuclear Magnetic Resonance on Nanoliter Volumes, *Appl. Phys. Lett.* 70, 2464-2466, (1997).

Y. J. Kim et al., Surface Micromachined Solenoid Inductors for High Frequency Applications, *IEEE Trans. Compon. Pack. Manuf. C* 21, 26-33, (1998).

G. Boero et al., Fully Integrated Probe for Proton Nuclear Magnetic Resonance Magnetometry, Rev. Sci. Instrum. 72, 2764-2768, (2001).

M.M. Midzor et al., Imaging Mechanims of Force Detected FMR Microscopy, *J. Appl. Phys*. 87, 6493-6495, (2000).

H. J. Mamin et al., Subattonewton Force Detection at Millikelvin Temperatures, *Appl. Phys. Lett*. 79, 3358-3360, (2001).

H. J. Mamin et al., Superconducting Microwave Resonator for Millikelvin Magnetic Resonance Microscopy, *Rev. Sci. Instrum*. 74, 2749-2753 (2003).

C. Ascoli et al., Micromechanical Detection of Magnetic Resonance by Angular Momentum Absorption, *Appl. Phys. Lett*. 69, 3920-3922(1996).

M. Lohndorf et al., Ferromagnetic Resonance Detection with a Torsion-Mode Atomic-Force Microscope, *Appl. Phys. Lett* . 76, 1176-1178, (2000).

J. Moreland et al., Ferromagnetic Resonance Spectroscopy with a Micromechanical Calorimeter Sensor, *Rev. Sci. Instrum*. 71, 3099-3103, (2000).

A. Jander et al., Angular Momentum and Energy Tranferred Through Ferromagnetic Resonance, *Appl. Phys. Lett*. 78, 2348-2350, (2001).

Ya. S. Greenberg, Application of Superconducting Quantum Interference Devices to Nuclear Magnetic Resonance, *Rev. Mod. Phys*. 70, 175-222, (1998).

H. Bergh, Nonlinear Coupling and Radiation Damping in Oscillator-Detected Magnetic Resonance of Single Spins, *Meas. Sci. Technol.*, 7, 1019-1026, (1996).

A. Suter et al., Probe-Sample Coupling in the Magnetic Resonance Force Microscope, *J. Magn. Reson*. 154, 210-227, (2002).

* cited by examiner (a)

(b)

(c)

TWO-DIMENSIONAL MAGNETIC RESONANCE TOMOGRAPHIC MICROSCOPY

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

Provisional Application Ser. No. 60/471,803, filed on May 20, 2003, now abandoned by Mladen Barbic, entitled "Method for High Resolution Two-Dimensional Tomographic Magnetic Resonance Imaging Using Magnetic Probes,".

STATEMENT REGARDING FEDERALLY SPONSORED RESEARCH AND DEVELOPMENT

The invention was made with Government support under Grant No. DAAD 19-00-1-0392 awarded by the Army Research Office and Grant No. F49620-01-1-0497 awarded by the Air Force Office for Scientific Research. The Government has certain rights in this invention.

BACKGROUND OF THE INVENTION

1. Field of the Invention

The present invention relates generally to magnetic resonance imaging, and in particular, to a method, apparatus, and article of manufacture for high resolution two-dimensional tomographic magnetic resonance imaging using magnetic probes.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Magnetic resonance imaging [1][2] (MRI) has advanced at a rapid pace since initial proposals and demonstrations in 1973 [3][4], with applications in medical imaging attracting the most attention [5][6]. Advances in magnetic resonance microscopy have also been significant [8], recently reaching two-dimensional (2D) imaging resolution of 1 μm [9]. Improvements in conventional inductive methods of magnetic resonance detection [10][11] and application of imaging gradients have generally been used to achieve such advances. Although the possibilities of angstrom-scale resolution were pondered in the early days of MRI [4][12], the ultimate goal of achieving atomic resolution has remained elusive.

In 1991, an alternative method of applying the imaging gradients and detecting magnetic resonance, magnetic resonance force microscopy (MRFM)[13] was proposed, with the ultimate goal of single spin sensitivity and three-dimensional (3D) imaging capability. The technique relies on the atomic scale imaging gradients from the microscopic magnetic particle mounted on a micromachined mechanical cantilever for the appropriate detection sensitivity required for 3D single spin imaging [14]. Successful MRFM demonstrations were reported for the cases of electron spin [15] nuclear spin [16], and ferromagnetic [17] resonance systems. MRFM research has benefited from the low temperature implementations of the instrument [18], and rapid advances in the fabrication techniques for incorporating smaller magnetic particles [19][20], and more sensitive mechanical resonators [21]. However, reported MRFM imaging resolution of ~1 μm [22][23] remains at the level of inductive detection in conventional MRI.

A complementary atomic resolution magnetic resonance imaging method [24] may be used to significantly relax the challenging technical requirements of single spin detection by imaging discrete ordered crystal lattice planes where many spins coherently contribute to the magnetic resonance signal. Such an approach closely resembles the initial magnetic resonance imaging proposal [4][12] in which linear magnetic field gradients are used to selectively excite magnetic resonance in different atomic lattice planes and produce "diffraction"-like effects. However, the approach differs from the initial magnetic resonance imaging proposal by introducing nonlinear magnetic fields and field gradients from a ferromagnetic sphere to achieve atomic resolution magnetic resonance diffraction. By using various sample-detector coupling mechanisms [25], it may be shown that the realization of the long desired atomic resolution magnetic resonance diffraction of crystals may be within reach of available experimental techniques.

However, the prior art lacks the ability to conduct two-dimensional magnetic resonance microscopy of noncrystalline structures at an atomic resolution.

SUMMARY OF THE INVENTION

The invention introduces the concept of computerized tomographic microscopy in magnetic resonance imaging using the magnetic fields and field gradients from a ferromagnetic probe. A configuration may be used wherein a sample (two-dimensional or three-dimensional) is under the influence of a large static polarizing field, a small perpendicular radio-frequency field, and a magnetic field from a ferromagnetic sphere.

Despite the nonuniform and nonlinear nature of the fields from a microscopic magnetic sphere, the concepts of computerized tomography can be applied to obtain proper image reconstruction from the original spectral data by sequentially varying the relative sample-sphere angular orientation. Accordingly, atomic resolution magnetic resonance imaging of discrete periodic crystal lattice planes using ferromagnetic probes may be extended to two-dimensional imaging of noncrystalline samples with resolution ranging from micrometer to angstrom scales.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

In the present invention, a method extends the use of imaging gradient magnetic fields from ferromagnetic probes to magnetic resonance microscopy of non-crystalline disordered samples. Despite the non-uniform and nonlinear nature of the fields from a microscopic magnetic sphere, the concepts of computerized tomography can be applied to obtain proper image reconstruction from the original spectral data by sequentially varying the relative sample-sphere angular orientation.

The description below first reviews the concept of atomic resolution magnetic resonance diffraction of ordered crystals using the fields from a ferromagnetic sphere in order to set the stage for extending the technique to 2D magnetic resonance tomographic microscopy of non-crystalline samples.

Magnetic Resonance Imaging of Discrete Crystal Lattice Planes

The previously described model of atomic resolution magnetic resonance imaging of crystal lattice planes [24][25] relies on placing a ferromagnetic sphere in proximity of the surface of a crystal. A cobalt sphere, $r_0=50$ nm in radius, has a magnetization per unit volume of 1500 emu/cm$^3$. The simple cubic lattice crystal is assumed to have a unit cell size of $a_0=3$ Å. A large dc magnetic field $B_0$ is applied parallel to the sample surface in the z direction, polarizing the spins of the atomic lattice as well as saturating the magnetization of the ferromagnetic sphere. A small radio frequency field $B_1$ is applied perpendicular to the large polarizing dc magnetic field $B_0$. The magnetic field from the ferromagnetic sphere at point r in the sample has the following azimuthally symmetric dipolar form:

$$B(r) = \frac{3n(m \cdot n) - m}{|r|^3}, \quad \text{[Equation (1)]}$$

where n is the unit vector that points from the center of the ferromagnetic sphere to the crystal site location and m is the magnetic moment vector of the sphere.

Since the external dc polarizing magnetic field $B_0$ is considered to be much larger than the field from the ferromagnetic sphere, only the z component of the magnetic field from the ferromagnetic sphere is included when considering the resonant spins of the atomic lattice [7][24]–[26]:

$$B_z(r) = \frac{M_0}{|r|^3}(3\cos^2\theta - 1), \quad \text{[Equation (2)]}$$

where θ is the angle between the z axis and the distance vector r, and $M_0$ is the magnitude of the saturation magnetic moment of the ferromagnetic sphere.

Figure 1:
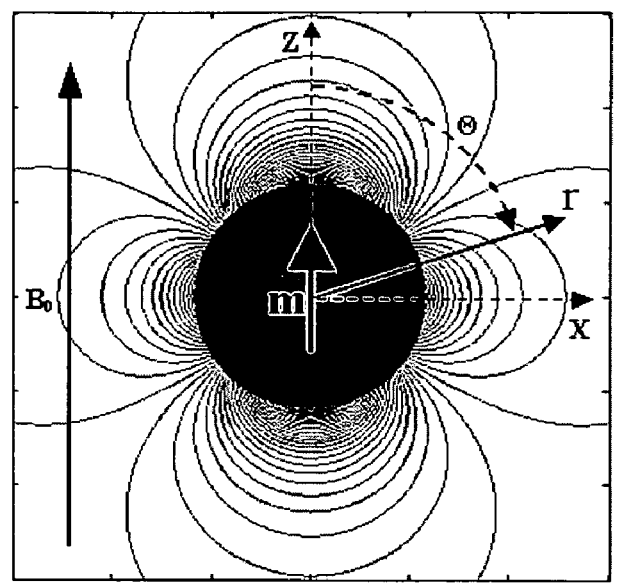
FIG. 1 shows the contours of constant values of the z component of a magnetic field from a ferromagnetic sphere in accordance with one or more embodiments of the invention.

FIG. 1 shows the contours of constant values of the z component of the magnetic field from the sphere, $B_z$, that have the azimuthally symmetric form around the z axis. As illustrated, the spins of the sample laying on the same contour have the same magnetic resonance frequency. For a 100 nm diameter cobalt sphere, the magnetic field gradients are sufficiently large that the discrete nature of the spins of the sample may need to be taken into account.

In the absence of the ferromagnetic sphere, the discrete nuclear spin sites in the crystal may experience the same externally applied field $B_0$ and therefore meet the magnetic resonance condition at the same magnetic resonance frequency $\omega_R$. However, close to the ferromagnetic sphere, a large magnetic field gradient penetrates into the crystal, and only certain spin sites of the lattice satisfy the correct magnetic resonance conditions at any given magnetic field and frequency values.

Figure 2:
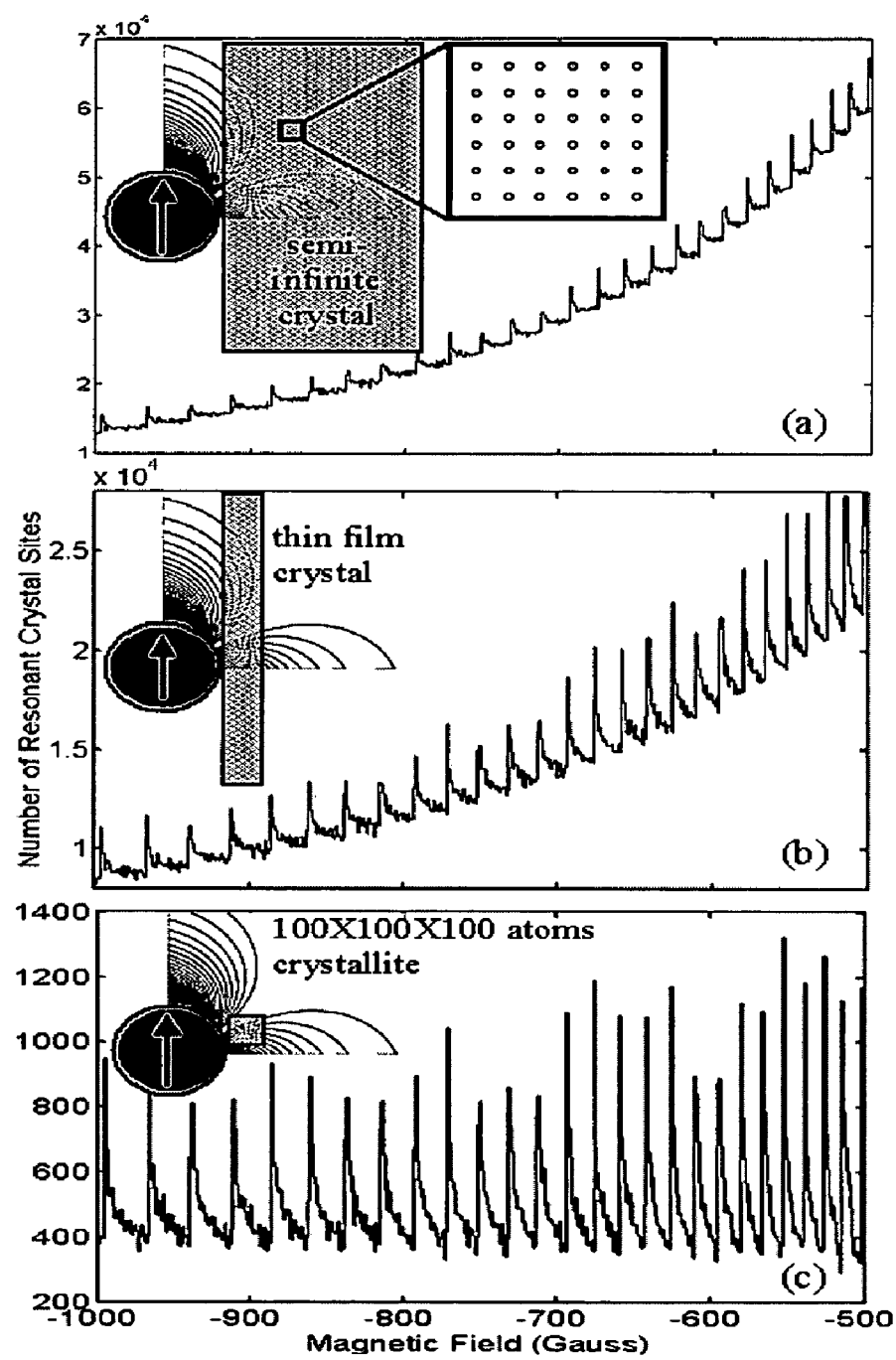
FIGS. 2(a), 2(b), and 2(c) reproduce the magnetic resonance spectra for crystalline structures next to a 100 nm diameter cobalt ferromagnetic sphere for the three cases: (a) semiinfinite crystal, (b) thin film 100-unit-cells in thickness, and (c) 100-by-100-by-100 atoms crystallite in accordance with one or more embodiments of the invention.

In the initial model [24][25], a numerical summation was computed to construct a histogram of the number of resonant spin sites in the sample within a 1 G wide shell of constant $B_Z$. This value of the bin width was selected since the linewidth broadening in solids is on the order of 1 G [26]. Distinct spectral peaks were discovered in the number of resonant spin sites with respect to the applied magnetic field in the negative value range. FIGS. 2(a), 2(b), and 2(c) reproduce the magnetic resonance spectra for crystalline structures next to a 100 nm diameter cobalt ferromagnetic sphere, between the field range of $B_0=-1000$ G and $B_0=-500$ G for the three cases: (a) semiinfinite crystal, (b) thin film 100-unit-cells in thickness, and (c) 100-by-100-by-100 atoms crystallite, with the insets of the figures indicating the sample-sphere relative positions. A reduction of the sample size results in increased spectral peak contrast.

Figure 3:
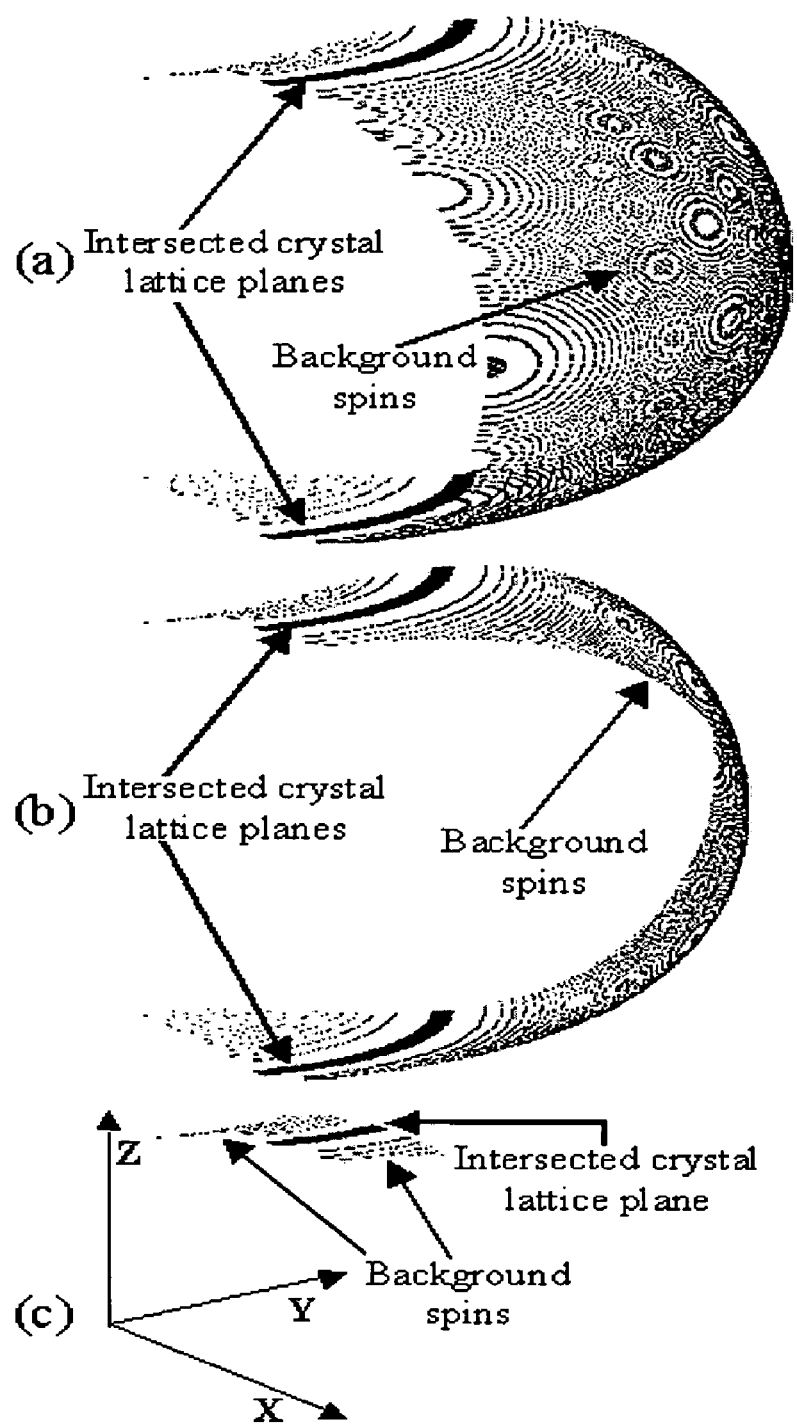
FIGS. 3(a), 3(b), and 3(c) show three representation plots for crystal lattice spin sites in accordance with one or more embodiments of the invention.

The appearance of spectral peaks was explained using the 3D plots of the resonant spins under the influence of the polarizing magnetic field $B_0$ and the magnetic field from a ferromagnetic sphere [24][25]. FIGS. 3(a), 3(b), and 3(c) show three such representation plots for crystal lattice spin sites that are in resonance at the magnetic field value of $B_0=-625$ G, the location of one of the sharp resonant peaks in the spectra of FIGS. 2(a), 2(b), and 2(c). A black dot is placed for every lattice site for which the field at that site is within 1 G of the resonant magnetic field. Only the positive values for the y axis are plotted for clarity. Dark bands of spins from the crystal lattice planes perpendicular to the magnetic field direction are responsible for the sharp spectral peaks. For semi-infinite crystal in FIG. 2(a), there is a large background signal that is diminished for the thin crystalline film in FIG. 2(b) since there are no resonant spins beyond the $100^{th}$ cell in the x-direction. The background signal is further minimized for the case of a small crystallite in FIG. 2(c). The discrete nature of the spins in the crystal lattice is required for the observation of magnetic resonance spectral peaks.

At this magnetic field value (e.g., at −625 G), sections of the shell of constant $B_Z$ perpendicular to the crystal surface intersect the crystal lattice so that a large number of spin sites from the lattice plane at the top and bottom sections of the resonant shell satisfy the resonance condition. The bands of the resonant atoms from the lattice planes are clearly visible, and the resonant ring bands like these at the distinct magnetic field values are responsible for the sharp peaks in the magnetic resonance spectra of FIGS. 2(a), (b), and (c).

It is emphasized that the appearance of the sharp magnetic resonance spectral peaks may only be possible by incorporating into the model the discrete nature of the atomic lattice sites, since magnetic resonance of a continuous medium would result in the monotonic spectrum. It is also noted that this magnetic resonance imaging technique specifically requires $B_0$ to be significantly larger than the field from the ferromagnetic sphere, say ~10 (T) external magnetic field versus 0.1–1 (T) field from the ferromagnetic sphere. If the external magnetic field is comparable in magnitude to the magnetic field from the ferromagnetic sphere, contours of constant magnetic field magnitude may need to be considered. A review of magnetic fields in this regime [27] reveals that the contours of constant magnitude of magnetic field may not have the appropriate azimuthally symmetric form for the technique to be viable.

Tomographic Magnetic Resonance Microscopy

Following the description of imaging of crystal lattice planes using ferromagnetic probes, the main question remains as to whether the technique can be extended to the imaging of noncrystalline samples. Inspection of the 3D images of FIGS. 3(a), 3(b), and 3(c), showing the resonant spin sites at a particular value of the magnetic field for crystalline samples with different dimensions, reveals particular features that open the possibility of extending the technique to tomographic imaging of noncrystalline samples.

It is apparent from the spectrum of FIG. 2(a) and the 3D image of FIG. 3(a) that the sharp spectral peaks for the semi-infinite crystal come from the very narrow regions of the sample, while there is a large background signal from other resonant spin sites that are intersected by the 1-G-thick shell of constant $B_Z$. For the thin film with 100-unit-cell thickness of FIG. 2(b), the spectral contrast is significantly increased. The resonant peaks occur at the same location as for the semi-infinite crystal of FIG. 2(a), but they lack the large background signal because there are no atoms intersected by the resonant shell beyond the 100th unit cell along the x direction, as shown in the FIG. 3(b).

There is still a background signal in FIG. 2(b) from the spins that are not part of the crystal lattice planes of interest, but their effect on the spectrum contrast is significantly reduced. The background signal from the spins away from the crystal lattice planes of interest are further minimized for the case of the small crystallite shown in FIGS. 2(c) and 3(c).

Since the spectral contrast may be increased by the reduction of the sample size, the idea of tomographic magnetic resonance imaging of two-dimensional samples may be introduced. The two dimensional samples have sizes of ~1/10 the size of the ferromagnetic sphere and may be positioned as shown in FIGS. 4(a), 4(b), and 4(c).

The sample can represent either a small molecule or protein ~10 nm in size underneath a 100 nm diameter ferromagnetic sphere, or a biological cell ~10 μm in size under a sphere 100 μm in diameter. The use of the sphere model and these sphere dimensions are reasonable, as ferromagnetic spheres in this size range have been successfully fabricated [28]–[31] and have already been integrated as probes on cantilever structures for unrelated applications [32]–[34]. Modeling of the technique that includes sphere imperfections (that would undoubtedly introduce imaging aberrations) may also be conducted.

FIG. 4(a) illustrates the positioning of the ferromagnetic sphere in relation to the sample. By magnifying the side view of the model arrangement, as shown in FIG. 4(b), it is observed that the sample is intersected by approximately perpendicular lines of constant $B_Z$ along the x direction. A second view is shown in FIG. 4(c) where the front view of the configuration of FIG. 4(a) is shown. By taking into consideration the large radius of curvature of the azimuthally symmetric intersecting contours of constant $B_Z$ (shown in FIG. 4(a)), it is apparent that the sample is intersected by approximately parallel lines of constant $B_z$ along the y direction. Therefore, for an approximately flat two-dimensional sample with lateral dimensions smaller than the ferromagnetic sphere size, the magnetic resonance spectra will be the one-dimensional projections of the spin density along the z axis.

However, as FIG. 4(c) shows, the lines of constant $B_z$ are not equally spaced along the z axis, since the magnetic field is not linear along the z axis. Nevertheless, since the magnetic field is well defined in the sample region (see Equation (2) above), this nonlinearity can be compensated for in the computerized tomographic image reconstruction.

Figure 4:
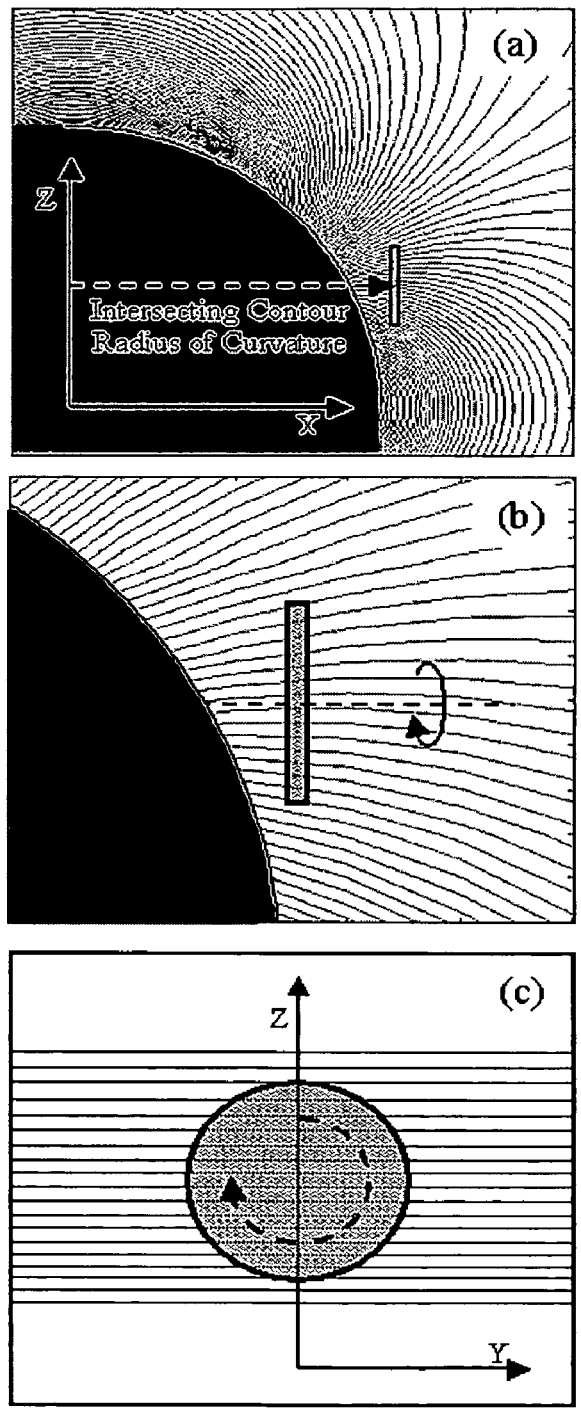
FIGS. 4(a), 4(b), and 4(c) illustrate the positioning of a two-dimensional sample with respect to the ferromagnetic sphere and the sphere's magnetic field contours in accordance with one or more embodiments of the invention.

The realization that the magnetic resonance spectrum of the sample in the configuration shown in FIG. 4 is a one-dimensional projection of the spin density along the z axis leads to the possibility of performing a high-resolution computerized tomographic reconstruction imaging.

Imaging of samples through projections [35] has been an important concept ever since the discovery of x-rays [36] and has been used in gravitational theory [37] and radio astronomy [38] before becoming widespread through computerized tomography [39] in x-ray [40], electron [41], and optical [42] imaging, among others. Computerized tomographic image reconstruction algorithms are well known [43]–[45]. One or more embodiments of the present invention may apply similar principles to the case of magnetic resonance tomographic microscopy using ferromagnetic spheres. However, it should also be noted that the image reconstruction from projections in magnetic resonance dates back to the first report of spin distribution imaging [3], and is still performed in the technique of stray field magnetic resonance imaging [46] where constant magnetic field gradients, on the order of 60 T/m, from superconducting magnets are used.

One or more embodiments of the invention provide for the use of ultrahigh gradient fields (from microscopic ferromagnetic probes, as used in magnetic resonance force microscopy [14][~$5 \times 10^6$ T/m for a 100 nm diameter cobalt sphere]), in tomographic imaging of non-crystalline samples with resolution reaching angstrom levels.

Figure 5:
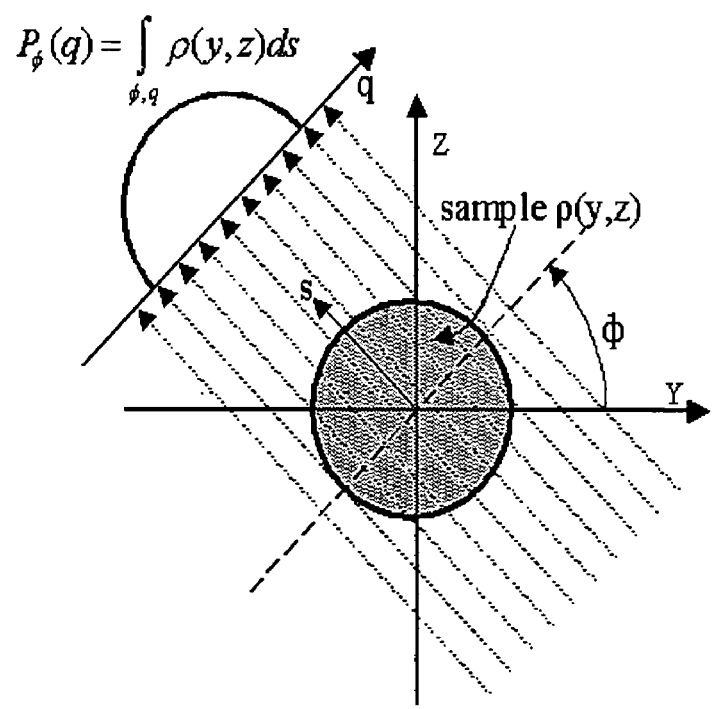
FIG. 5 shows the schematic representation of the configuration and accompanying parameters that may be used in an image reconstruction process in accordance with one or more embodiments of the invention.

FIG. 5 shows the schematic representation of the configuration with the parameters used in the image reconstruction process in accordance with one or more embodiments of the invention. In the conventional computerized tomography [41], uniformly separated parallel rays are used to obtain an image projection along an axis, and the one-dimensional Radon transform of the sample density function $\rho(y,z)$ is formed $$P_\phi(q) = \int_{(\phi,Q)line} \rho(y,z) ds. \quad \text{[Equation (3)]}$$

By obtaining a multiple of one-dimensional Radon transforms (Equation (3)) at different angles $\phi$, image reconstruction is performed by the Fourier transform filtered back projection algorithm for parallel projections [7]:

$$\rho(y,z) = \int_0^\pi \left\{ \int_{-\infty}^{+\infty} \left[ \int_{-\infty}^{+\infty} P_\phi(q) \cdot e^{i2\pi kq} dq \right] |k| e^{-i2\pi kq} dk \right\} d\phi \quad \text{[Equation (4)]}$$

This reconstruction process involves calculation of the Fourier transform of the radon transform (innermost bracketed term), multiplication by a ramp function |k| in conjugate space followed by an inverse transformation (outer bracketed term), and finally integration over all angles for the completion of the image reconstruction (outermost integration term) [7].

In one or more embodiments of the invention, a two-dimensional phantom is simulated with equally separated 9-by-9 array of spins in the y-z plane as illustrated in FIGS. 6(a)–6(d). It may be initially assumed that the points are individual proton nuclear spins separated by 5 Å, each having a Lorentzian resonant response with a 10 G linewidth. In the Cartesian coordinate system, the z component of the magnetic field from a ferromagnetic sphere [Equation (2)] has the form $$B_z(x,y,z) = \frac{M_0(2z^2 - x^2 - y^2)}{(x^2 + y^2 + z^2)^{5/2}} \quad \text{[Equation (5)]}$$

The center of the phantom array is placed next to the sphere as shown in FIG. 4, so that the contours of constant $B_z$ of Equation (5) are approximately perpendicular to the phantom along the x axis, and parallel to the phantom along the y axis. This location is determined by the condition that $$\frac{\partial B_z}{\partial x} = \frac{\partial B_z}{\partial y} = 0 \quad \text{[Equation (6)]}$$

and it was previously shown that at this location [25]

$$x^2 + y^2 = 4z^2 \quad \text{[Equation (7)]}$$

Therefore, when the sample is centered on the y axis ($y_0 = 0$), as shown in FIG. 4(c), the phantom is positioned along the z axis as shown in FIGS. 4(a)–4(b) at the $z_0$ value of $$r_0^2 = 4z_0^2. \quad \text{[Equation (8)]}$$

Figure 6:
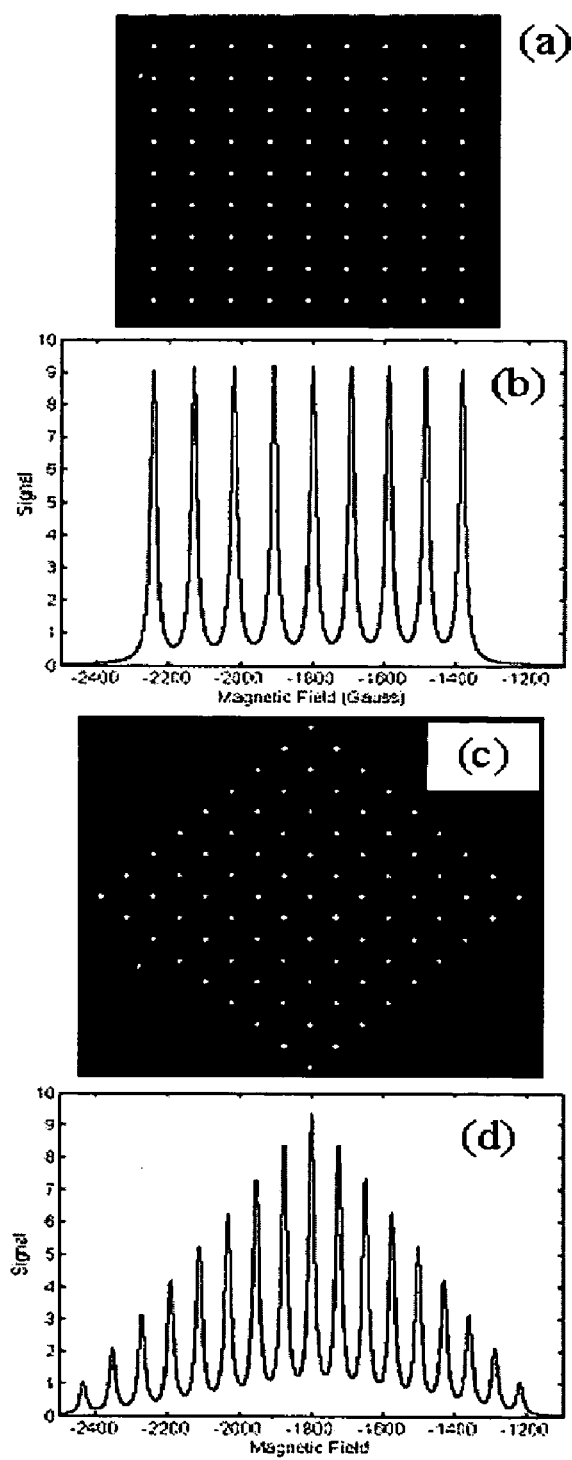
FIGS. 6(a)–6(d) illustrate a two-dimensional phantom simulated at two different angles (FIGS. 6(a) and 6(c)) and accompanying magnetic resonance spectra (FIGS. 6(b) and 6(d)) in accordance with one or more embodiments of the invention.

FIGS. 6(b) and 6(d) show the spectrum of this system of spins under the influence of the large polarizing magnetic field and the field from the ferromagnetic sphere for two imaging angles, 0° and 45°, respectively. There are several observations with respect to FIGS. 6(a)–(d) that are pertinent to the image reconstruction process. It is immediately apparent that the projection along a single angle is not an ideal projection as described by Equation (3), but is modified by two distorting factors. The first distorting factor is that the projection in tomographic magnetic resonance microscopy of a single spin is a convolution of the point projection with the Lorentzian line shape L(q) along the projection line $$R_\phi(q) = \int_{(\phi,q)line} P_\phi(q') L(q - q') dq' \quad \text{[Equation (9)]}$$

The second, and more serious distortion, is the nonlinearity of the projection due to the nonlinear variation of the magnetic field along the z axis. As described above, in the configuration shown in FIG. 4, the one-dimensional radon transforms are not obtained by the uniformly separated parallel rays of constant $B_z$, but by the contours that have an increasing separation along the z direction, as FIG. 4(c) illustrates.

Figure 7:
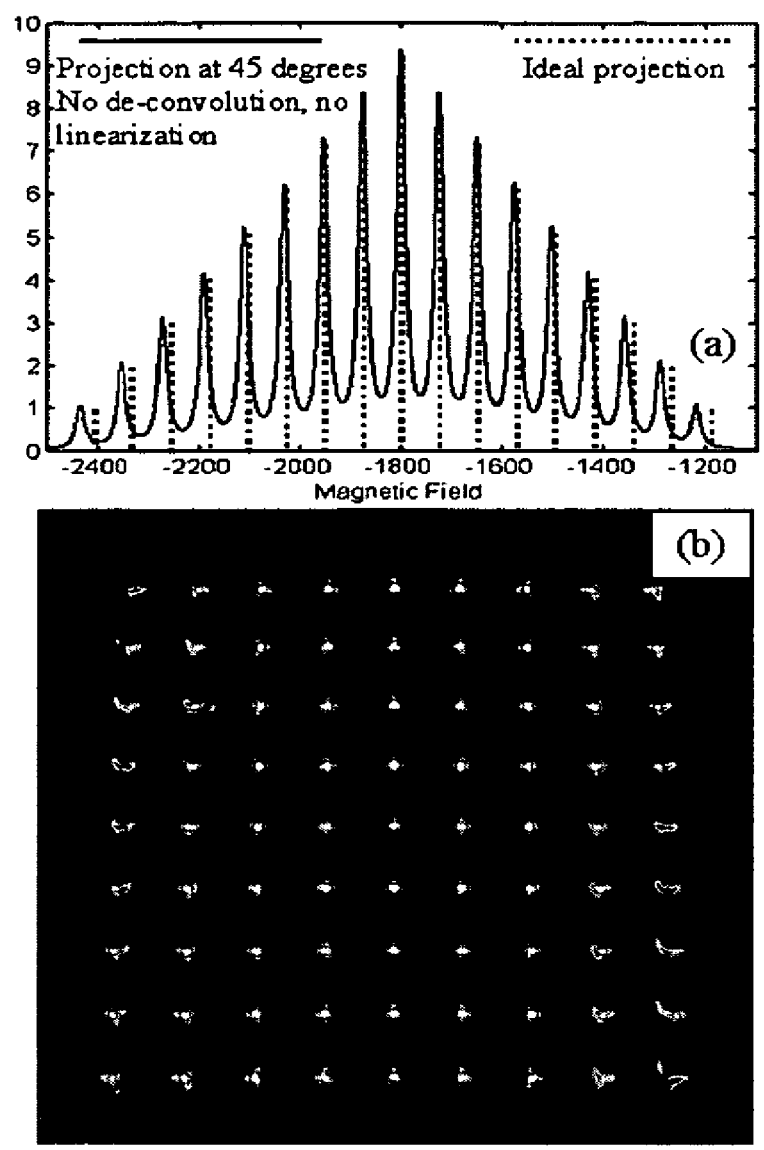
FIG. 7(a) illustrates a projection at 45° superimposed by an ideal projection in accordance with one or more embodiments of the invention.
FIG. 7(b) illustrates a reasonable reconstruction of a sample spin density without linearization and de-convolution, in accordance with one or more embodiments of the invention.

FIG. 7(a) shows the projection at 45° superimposed by the ideal projection that one would wish to observe where the response of a spin is a delta function. As opposed to detecting a series of equally spaced delta functions whose heights represent the number of spins along a projection line, the image is a series of Lorentzian line shapes that are not evenly spaced and therefore do not represent a true sample projection. However, despite this distortion, if image reconstruction is performed by the Fourier transform filtered backprojection algorithm for parallel projections of Equation (4), one obtains a reasonable reconstruction of the sample spin density, as FIG. 7(b) illustrates. The image in FIG. 7(b) was reconstructed from 90 simulated projections at 2° apart without linearization and deconvolution. The image is mostly distorted on the edges of the sample where the nonlinearity most significantly effects the projection. In addition, since the projection of a single spin is not an ideal delta-function projection, but is a projection convoluted by the Lorentzian line shape (Equation (9)), the contrast in the image is also reduced as compared to the original phantom.

Figure 8:
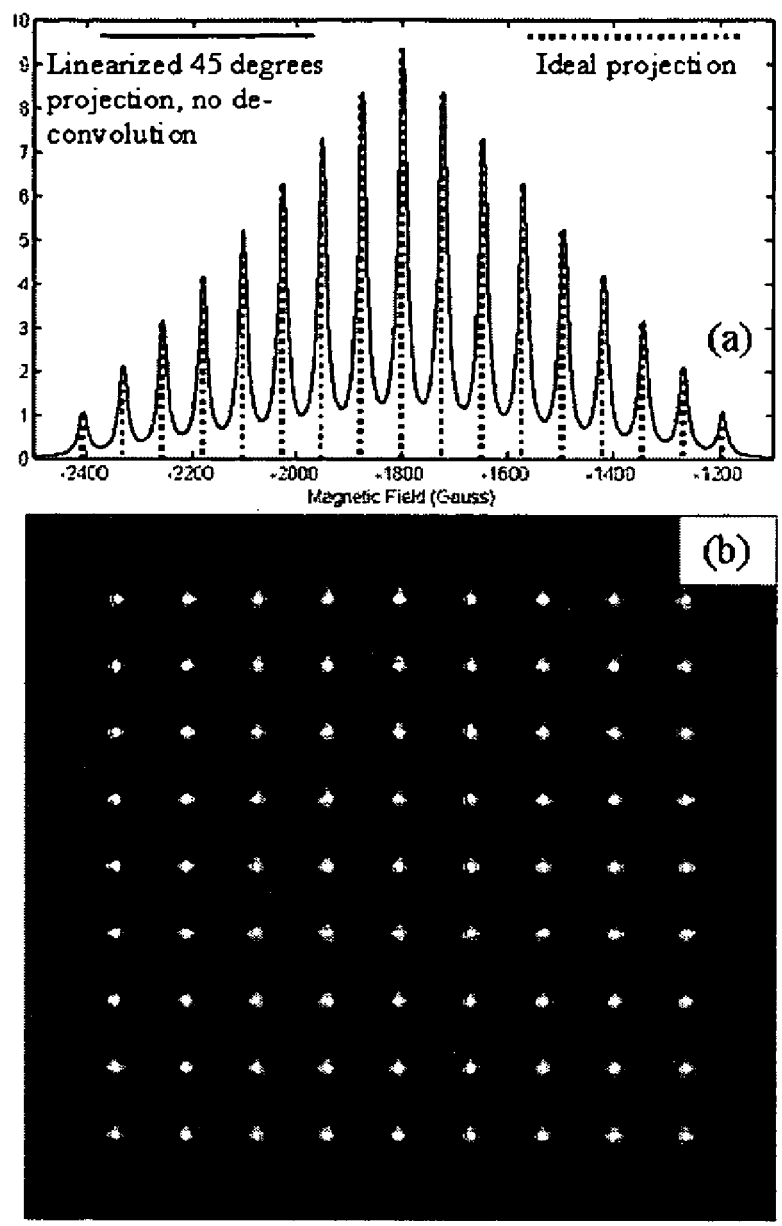
FIG. 8(a) illustrates a linearized projection at 45° superimposed by an ideal linearized and de-convolved projection in accordance with one or more embodiments of the invention.
FIG. 8(b) illustrates a reasonable reconstruction with non-linear distortions eliminated in accordance with one or more embodiments of the invention.

The magnetic field component (Equation (5)) used for magnetic resonance imaging may be used to correct the nonlinear projection distortion prior to the initial step in the Fourier transform filtered backprojection algorithm. The resulting linearized representative projection at an angle of 45° and the full reconstruction from 90 simulated projections at 2° apart are shown in FIGS. 8(a) and 8(b), respectively. As illustrated, the computed image is now a very good reconstruction of the original phantom. The reconstructed image still has worse contrast than the original due to the Lorentzian line shape convolution effect. However, if the single spin response is known (which may be assumed for the Lorentzian response for the single spin magnetic resonance) it is still possible to further improve the image reconstruction by: (a) first deconvolving each projection from the Lorentzian line shape, then (b) perform the linearization, and finally (c) perform the Fourier transform filtered backprojection by using the algorithm for parallel projections of Equation (4) to obtain the final image.

Figure 9:
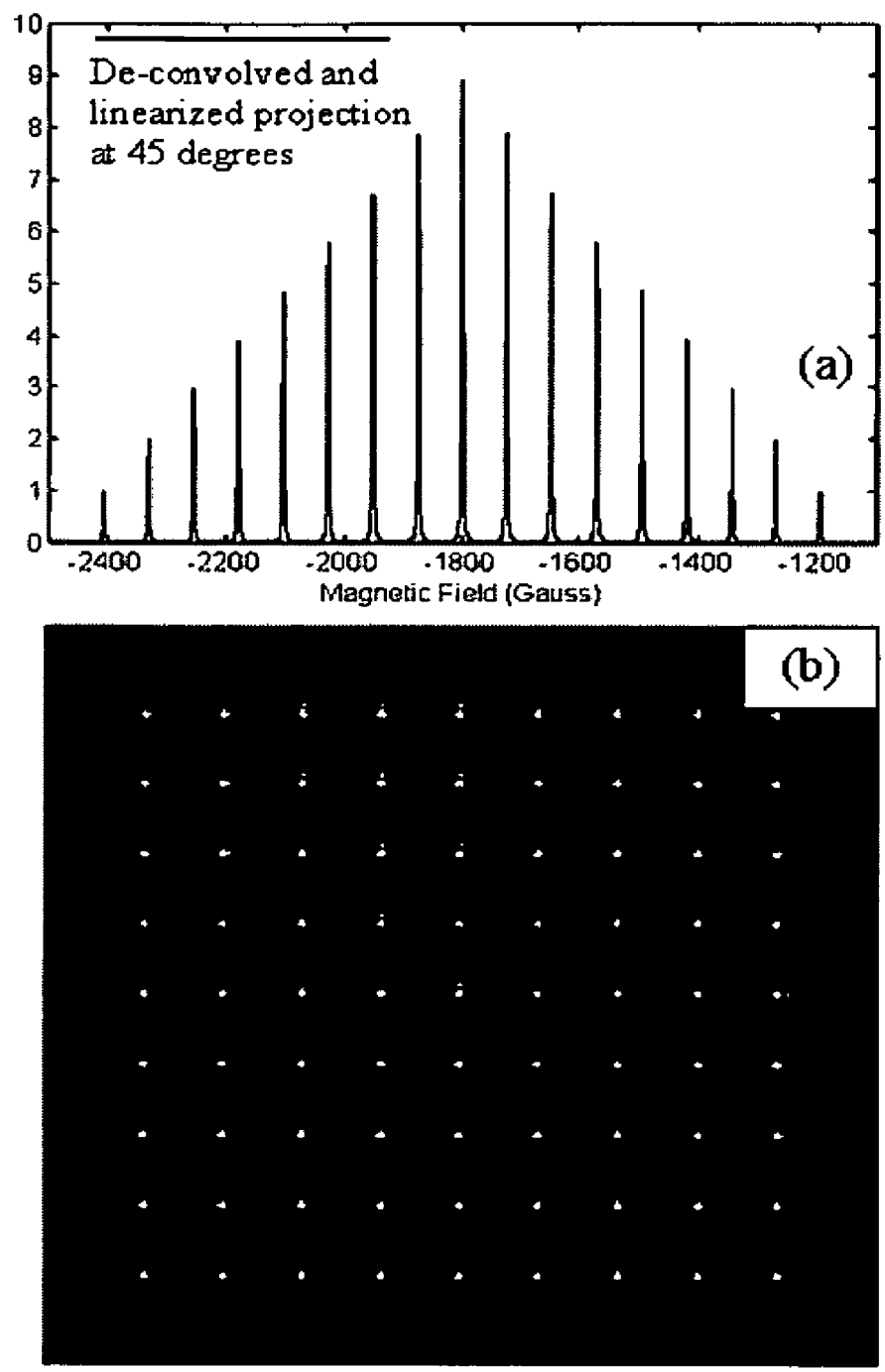
FIG. 9(a) illustrates a linearized and de-convolved projection in accordance with one or more embodiments of the invention.
FIG. 9(b) illustrates an image reconstruction in accordance with one or more embodiments of the invention.

A deconvolved and linearized projection at a representative angle of 45° is shown in FIG. 9(a), and the final computed image from 90 simulated projections at 2° apart is shown in FIG. 9(b) where excellent reconstruction of the original image is observed.

Figure 10:
FIGS. 10(a)–10(c) show the computed images of three successively improved reconstructions, respectively, where 90 simulated projections at 2° apart are used in accordance with one or more embodiments of the invention.
Figure 10:
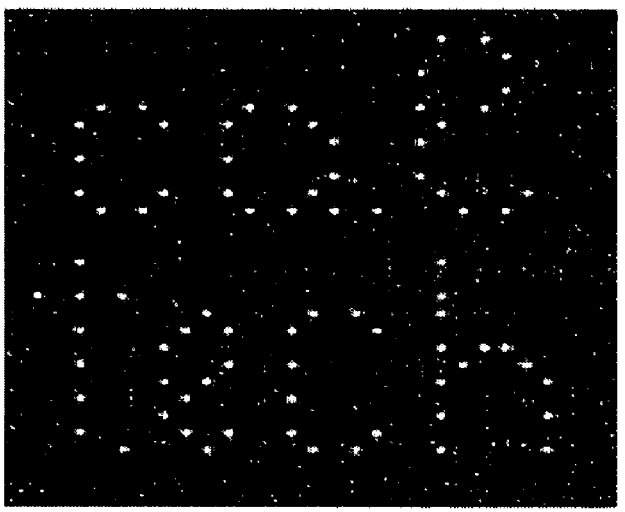
Figure 10:
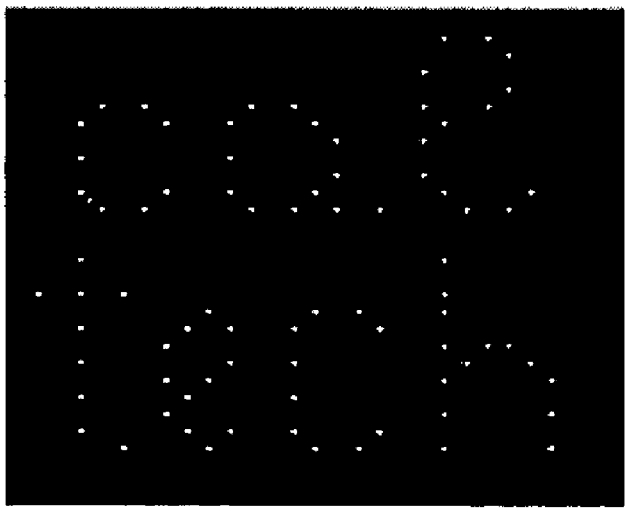

As described above, in accordance with one or more embodiments of the invention, two-dimensional tomographic imaging can be performed on samples that are different from the regular ordered arrays of spins. FIGS. 10(a)–10(c) illustrate a simulated image where the term "cal tech" appears. The projections of the sample will not have regular periodic features as presented above. Nevertheless, the presented tomographic magnetic resonance imaging method is designed to successfully reconstruct the original image, provided a sufficient number of projections are obtained. FIGS. 10(a)–10(c) show the computed images of three successively improved reconstructions, respectively, where 90 simulated projections at 2° apart are used. FIG. 10(a) is a direct reconstruction using Equation (4) without performing the deconvolution and linearization of projections. As previously described, the image has significant distortions on the edges due to the non-linear distortion of projections.

FIG. 10(b) is a reconstruction of linearized projections that have not been deconvolved from the Lorentzian line shape, and improved reconstruction is observed. FIG. 10(c) is a reconstruction that uses both deconvolution and linearization of projections before the final computed reconstruction using Equation (4). In FIG. 10(c), excellent reconstruction of the image as well as the contrast are illustrated.

Figure 11:
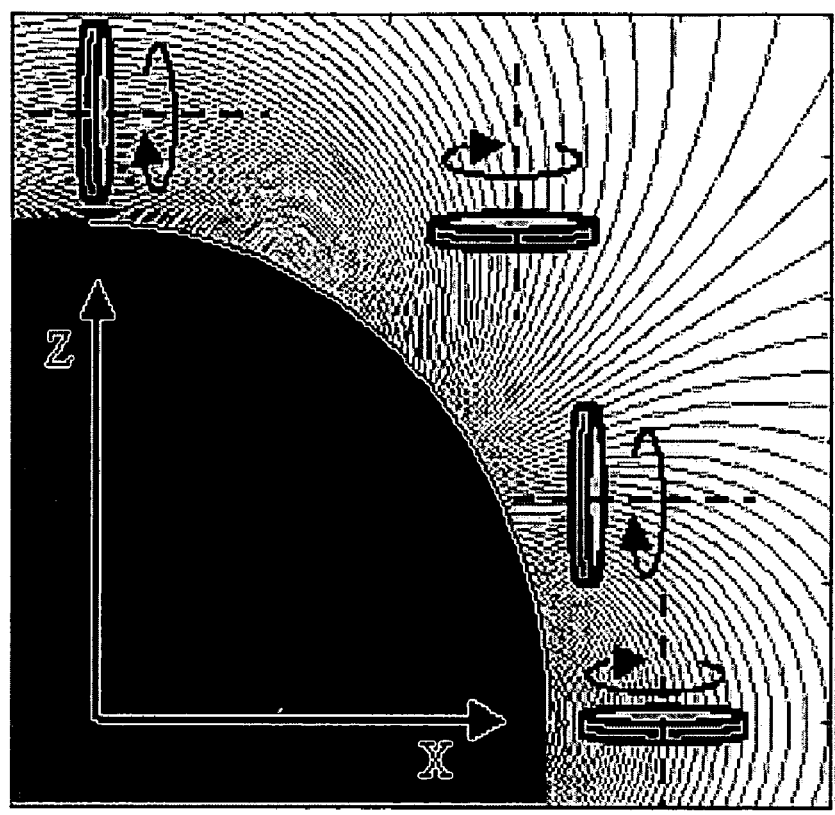
FIG. 11 illustrates several possible sample-sphere orientations and the respective sample rotation axis required for computerized tomographic image reconstruction in accordance with one or more embodiments of the invention.

As described above, the sample is located at the position where the contours of constant $B_Z$ are perpendicular to the sample surface, and sample placement with respect to the ferromagnetic sphere. FIG. 11 illustrates several other possible sample-sphere orientations and the respective sample rotation axis required for computerized tomographic image reconstruction. In all four cases shown in FIG. 11, the contours of constant $B_Z$ are perpendicular to the sample, but vary slightly in the intersecting radius of curvature. Which relative sample-sphere orientation is chosen will depend on the specific experimental and space requirements that might depend on the ferromagnetic probe [45][79], detector (e.g., mechanical force detectors [80]), rf coils [81], and polarizing magnet configurations. Detailed analysis of the effect of different configurations on the resolution, sensitivity, linearity, and sample-detector coupling, as well as the potential of extending the technique to three-dimensional computerized tomographic imaging may also be conducted.

In view of the above, it may also be observed that in most room temperature nuclear magnetic resonance (NMR) experiments, the fractional polarization is quite small, on the order of $10^{-5}$, and improves at helium temperatures to values on the order of $10^{-3}$. Such fractional polarization may have important implications for observing the magnetic resonance signal at those temperatures due to the significant spin noise background. However, cantilever operation at millikelvin temperatures has been demonstrated [18] and similar technical advancements might alleviate the spin noise problem. Nonetheless, it should be noted that the spin noise problem in magnetic resonance is a topic of ongoing investigations and still somewhat controversial and not well understood [47][48].

Additionally, the invention has focused on cobalt as the material of choice, but magnetic materials with similar saturation magnetization but higher anisotropy, such as rare earth alloy PrFeB, may be used to reduce thermal fluctuations of the sphere probe [20][49].

It should also be emphasized that although the invention may be aimed at the MRFM community for the realization of tomographic magnetic resonance imaging, many other detection systems (e.g., to improve imaging capabilities in the detection of a small number of spins) may also use the invention. Examples of such alternative systems may include the detection of direct transfer of angular momentum [82][83] and energy [84][85] to the spin population in magnetic resonance using micromechanical cantilevers, flux-detection class of magnetic resonance detection schemes that may include microcoil NMR [50][87], microsuperconducting quantum interference device detectors [51][88], Hall sensors [52], superconducting resonators [53], and microwave waveguides [54], which may provide additional routes to the proposed potentially atomic resolution magnetic resonance tomographic microscopy. Flux detectors might also have additional advantages when compared to the force detectors with regards to the linearity of the probe-sample coupling [89], and specific sample-detector coupling mechanisms [25][89][90] may also be used.

Embodiments of the invention may not consider the specific phase coherence between the spins, as it is yet undetermined if the technique would be performed in cw [55] or pulsed nuclear magnetic resonance mode [56]. The presence of unusually large magnetic field gradients described above may have significant effects on the nuclear magnetic resonance pulse sequence used, but research into this field gradient regime may continue [57][58] and may result in the development of pulse sequences further that will make this proposal feasible in accordance with the invention and the pulsed NMR mode.

In addition to the above, one or more embodiments of the invention integrate a ferromagnetic sphere with an inductive micro-coil that may be used to detect and image spin distribution by the tomographic method described above. The history of custom wound micro-coils is well established, with examples ranging from the measurements of the Aharonov-Bohm effect [64], propagation of magnetic domain walls [65], high-sensitivity detection of electron [66][67], and nuclear spin resonance [68], microscopic electron and nuclear spin magnetic resonance imaging [69] [70][71], magnetic micromanipulation [72]–[74], and the application of high gradient alternative magnetic fields in the high-sensitivity force magnetometry [75]. Further techniques fabricate planar or three-dimensional coil structures [76]–[78].

Figure 12:
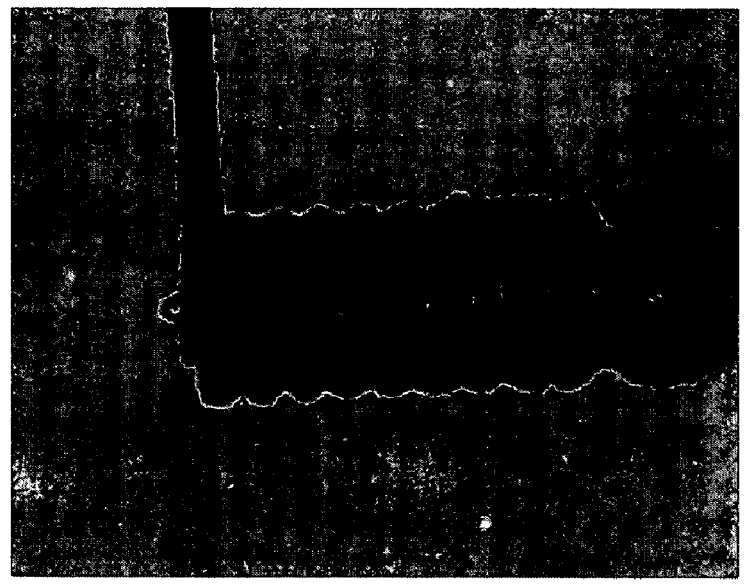
FIG. 12 illustrates an example device wherein a coil is positioned near a ferromagnetic sphere on the cleaved end of the optical fiber in accordance with one or more embodiments of the invention.

One or more embodiments of the invention utilize a micro-coil that is made by winding a 30 µm diameter magnet wire around an optical fiber. The functionality of such micro-coils has been extended towards magnetic resonance tomographic microscopy by incorporating a 15 µm diameter ferromagnetic Nickel micro-sphere on the cleaved end of the optical fiber. The coil is positioned near the ferromagnetic sphere on the cleaved end of the optical fiber, as FIG. 12 shows, to maximize the detection of the time varying magnetic field from the region of the sample in magnetic resonance. In FIG. 12, a nickel ferromagnetic sphere, 15-µm in diameter, is mounted on the cleaved end of a 65-µm diameter optical fiber. A magnet wire, 30-µm in diameter, is wound around the fiber for RF transmission and magnetic resonance detection.

Potential Devices

The invention may be implemented in several potential devices including inductive micro-coil structures, as well as nano-mechanical resonators that utilize nano-wire resonators integrated with colloidal metal nano-reflectors for optical detection of vibration.

Figure 13:
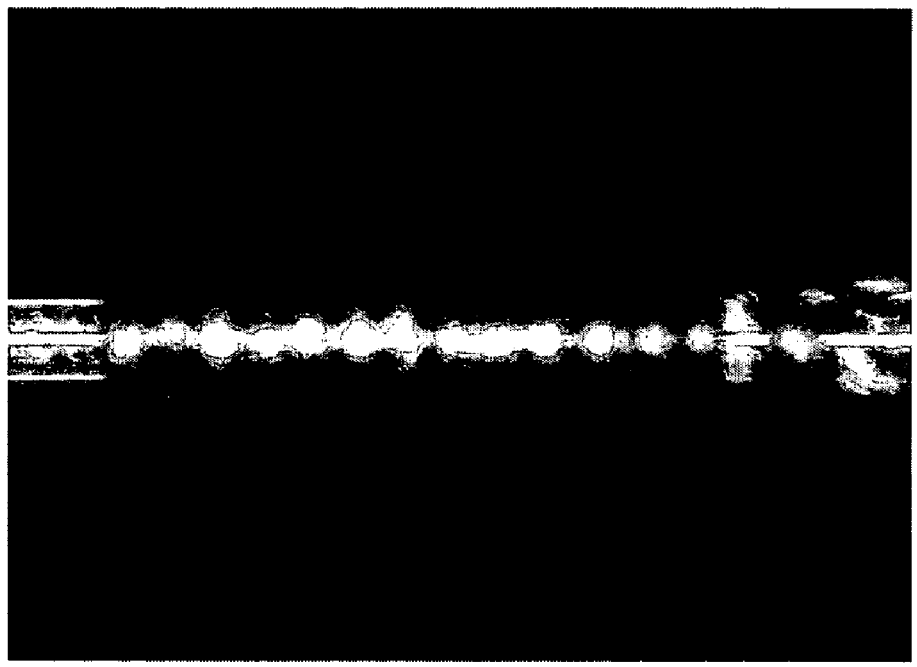
FIG. 13 illustrates a sample device wherein micro-coil structures are wound on capillary tubes filled with ferromagnetic material in accordance with one or more embodiments of the invention.

For the inductive detection of magnetic resonance, two devices may be used. One involves integrating ferromagnetic spheres with micro-coils wound on optical fibers (illustrated in FIG. 12), while the other one utilizes microcoil structures wound on the capillary tubes filled with ferromagnetic material (FIG. 13).

Figure 14C:
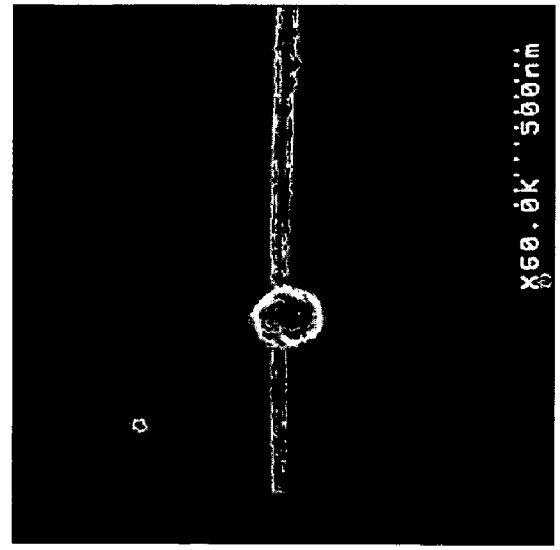
FIGS. 14(a) and 14(c) illustrate electron microscope images of a multi-functional nanostructure/nanowire resonator that may be used for high sensitivity detection in accordance with one or more embodiments of the invention.
Figure 14B:
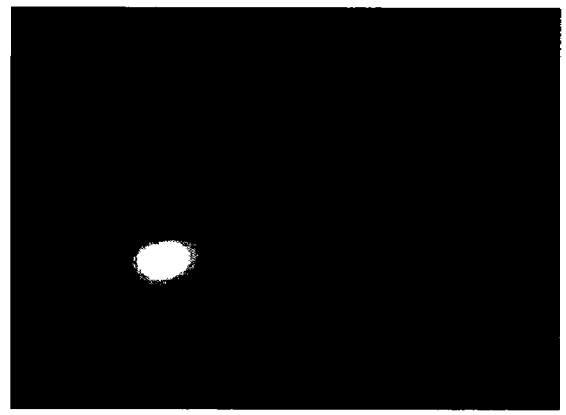
FIG. 14(b) illustrates an optical microscopic image of the nanowire resonator of FIG. 14(a) in accordance with one or more embodiments of the invention.
Figure 14A:
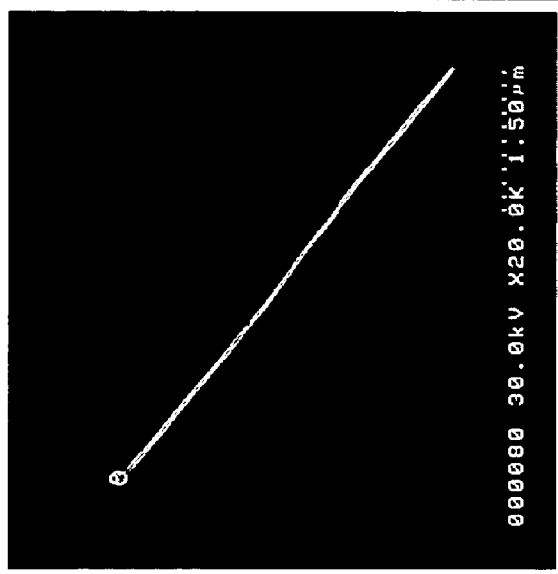
Figure 14D:
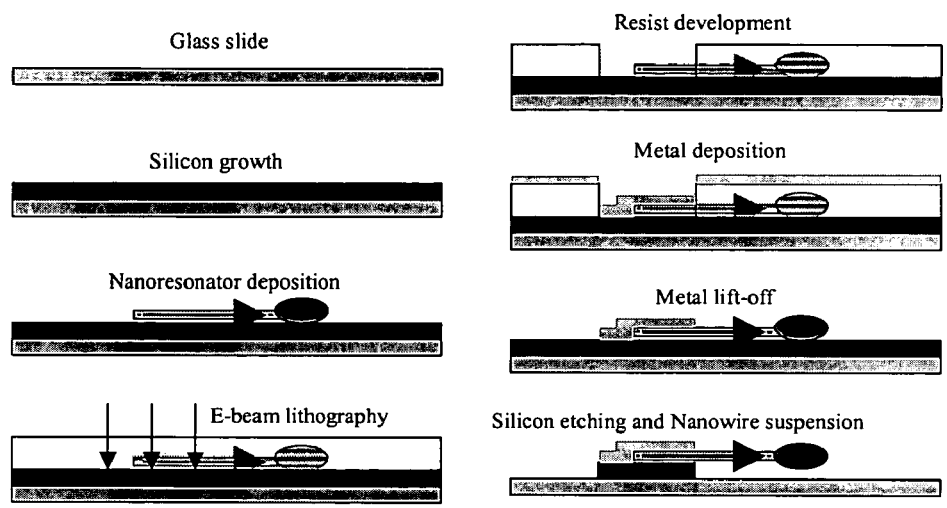
FIG. 14(d) illustrates the method of suspending the nanowire resonator of FIGS. 14(a), (b), and (c) in accordance with one or more embodiments of the invention.

For the case of mechanical detection of magnetic resonance vibration through optical means, nanowire resonators may contain all the necessary components for force detection of magnetic resonance: a) nano-magnetic particle for applying ultra-high magnetic field gradients, b) plasmonic metal colloids for optical detection of resonator vibration, and c) non-magnetic, non-plasmonic nano-wire structure as a cantilever for high sensitivity detection. FIGS. 14(a) and (c) illustrate electron microscope images of a multi-sectioned nanowire resonator that may be used for high sensitivity detection in accordance with one or more embodiments of the invention. In this regard, FIG. 14(c) illustrates a magnetic structure (on the left part of the image), a silver ball, and a non magnetic structure (on the right part of the image). FIG. 14(b) illustrates an optical microscopic image of the device illustrated in FIG. 14(a). FIG. 14(b) illustrates how bright the ball looks in an optical image. FIG. 14(d) illustrates the method of suspending the nanowire resonator of FIGS. 14(a), (b), and (c). As illustrated, silicon is grown on a glass slide followed by a nanoresonator deposition. Electron beam lithography is then used to define clamping pad on the nanoresonator. Metal is desposited and lifted off followed by silicon etching and nanowire suspension.

Figure 15:
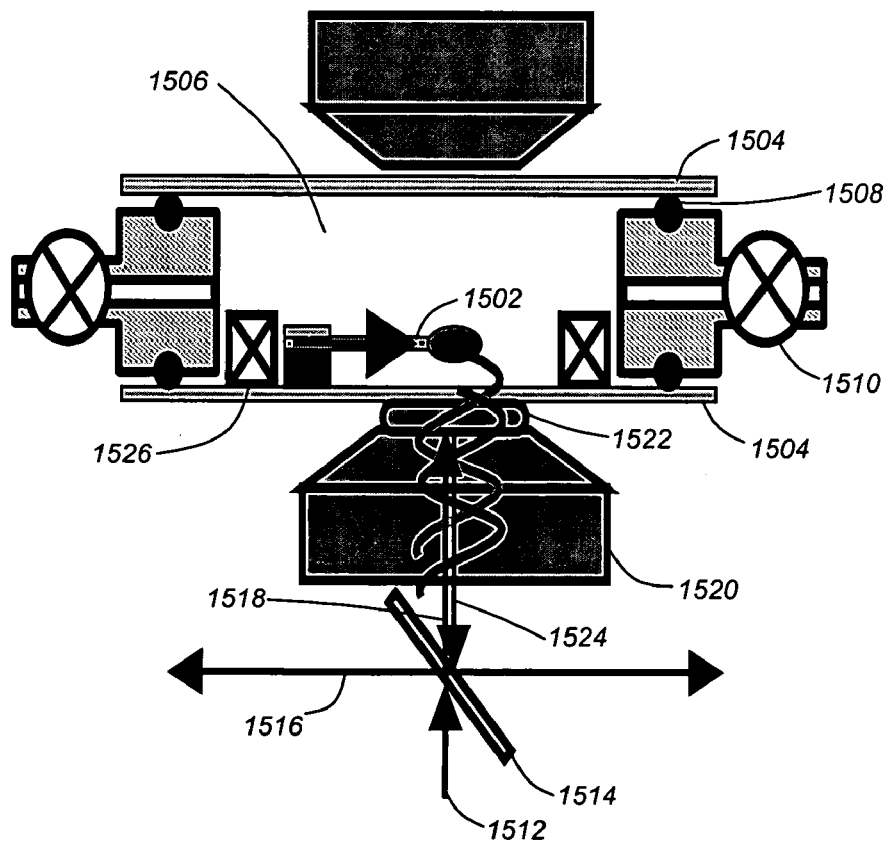
FIG. 15 illustrates an interferometric optical detection set-up that could be used for the measurement of a nanomechanical system in accordance with one or more embodiments of the invention.

FIG. 15 illustrates an interferometric optical detection set-up (containing the nanowire resonantor fabricated in FIGS. 14(a)–(d)) that could be used for the measurement of a nano-mechanical system. The nano-resonator 1502 is suspended between glass slide surfaces 1504 within a vacuum sealed chamber 1506 by the O-rings 1508 and vacuum valves 1510. An incoming laser beam 1512 is split by a beam splitter 1514. The reference signal 1516 is/may not be used and the data signal 1518 is focused on the colloidal nano-reflector (of the nano-resonator 1502). The data signal 1518 is focused by using optical lens 1520 and immersion oil/plasmon resonant colloid 1522 (that prevents a reflection from the bottom surface of the bottom slide 1504).

The reflected beam from the plasmon resonant colloid and the reflected beam from the glass slide surface form the interferometric signal 1524 that is used for the measurement of the nano-mechanical resonator 1502 vibration. One can also actuate the resonator by magnetic means using the micro-coil fields/microcoil actuator 1526. Thus, FIG. 15 presents a device for detecting movement through optical means in accordance with one or more embodiments of the invention.

Logical Flow

Figure 16:
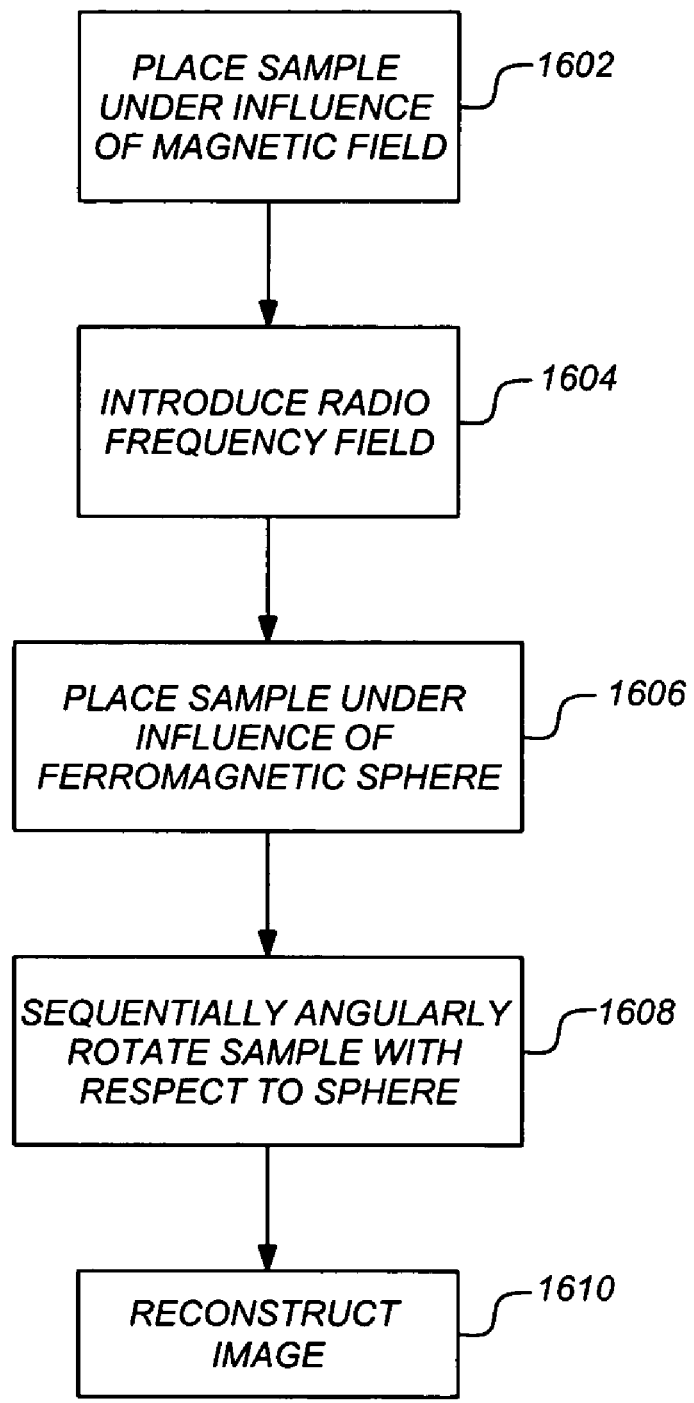
FIG. 16 is a flow chart illustrating the logical flow for conducting magnetic resonance tomographic microscopy in accordance with one or more embodiments of the invention

FIG. 16 is a flow chart illustrating the logical flow for conducting magnetic resonance tomographic microscopy in accordance with one or more embodiments of the invention. At step 1602, a non-crystalline sample (that may be two-dimensional or three-dimensional) is placed under the influence of a static polarizing magnetic field. Such a sample may take many forms including a small protein or molecule, cell or other biological or non-biological material of interest. At step 1604, a radio-frequency field is introduced perpendicular to the static polarizing first magnetic field.

At steps 1606 and 1608, two or more magnetically resonant spins of the sample are simultaneously obtained. As part of this process, the sample is placed under the influence of a ferromagnetic sphere having a second magnetic field at step 1606. Such a ferromagnetic sphere may be ~10 times the size of the sample. The placement of the sample such that contours of the second magnetic field from the ferromagnetic sphere are perpendicular to the sample in the x-z plane, but varying slightly in an intersecting radius of curvature.

At step 1608, the sample is sequentially angularly rotated, around a prescribed axis, with respect to the ferromagnetic sphere. Thus, multiple image projections of spins are obtained by rotating the sample with respect to the sphere.

At step 1610, an image of the sample is reconstructed based on the imaged spins projections using computerized tomography. Such reconstruction may be performed using a Fourier transform filtered backprojection algorithm for parallel projections of the magnetic resonance spins from the ferromagnetic sphere through the sample. In this regard, the reconstructing may be performed by a Fourier transform of a radon transform, multiplication by a ramp function in conjugate space, followed by an inverse transformation, and integration over all angles in accordance with Equation [4] above.

To more clearly reconstruct the image, the invention may correct for nonlinear projection distortion prior to a first step in the Fourier transform filtered backprojection algorithm. Alternatively (or in addition), each projection may be deconvolved from a Lorentzian line shape and linearized prior to performing the Fourier transform filtered backprojection.

Thus, the above described methodology provides computerized tomographic microscopy in magnetic resonance imaging using the magnetic fields and field gradients from a ferromagnetic probe. A configuration is utilized where a two-dimensional sample is under the influence of a large static polarizing field, a small perpendicular radio-frequency field, and a magnetic field from a ferromagnetic sphere. Despite the non-uniform and non-linear nature of the fields from a microscopic magnetic sphere, the concepts of computerized tomography can be applied to obtain proper image reconstruction from the original spectral data by sequentially varying the relative sample-sphere angular orientation as illustrated in FIG. 11.

In the invention, atomic resolution magnetic resonance imaging of discrete periodic crystal lattice planes using ferromagnetic probes are extended to two-dimensional imaging of non-crystalline samples with resolution ranging from micrometers to Angstrom scales.

REFERENCES

[1] P. Mansfield and P. G. Morris, *NMR Imaging in Biomedicine* (Academic, London, 1982).

[2] C.-N. Chen and D. I. Hoult, *Biomedical Magnetic Resonance Technology* (Adam Hilger, Bristol, 1989).

[3] P. C. Lauterbur, Nature (London) 242, 190 (1973).

[4] P. Mansfield and P. K. Grannell, J. Phys. C 6, L422 (1973).

[5] M. T. Vlaardingerbroek and J. A. den Boer, *Magnetic Resonance Imaging—Theory and Practice* (Springer, New York, 2003).

[6] F. W. Wehrli, Prog. Nucl. Magn. Reson. Spectrosc. 28, 87 (1995).

[7] P. T. Callaghan, *Principles of Nuclear Magnetic Resonance Microscopy* (Oxford University Press, New York, 1991).

[8] J. Aguayo, S. Blackband, J. Schoeniger, M. Mattingly, and M. Hintermann, Nature (London) 322, 190 (1986).

[9] S. C. Lee et al., J. Magn. Reson. 150, 207 (2001).

[10] D. I. Hoult and R. E. Richards, J. Magn. Reson. (1969–1992) 24, 71 (1976).

[11] D. I. Hoult and P. C. Lauterbur, J. Magn. Reson. (1969–1992) 34, 425 (1979).

[12] P. Mansfield and P. K. Grannell, Phys. Rev. B 12, 3618 (1975).

[13] J. A. Sidles, Appl. Phys. Lett. 58, 2854 (1991).

[14] J. A. Sidles, J. L. Garbini, K. J. Bruland, D. Rugar, O. Zuger, S. Hoen, and C. S. Yannoni, Rev. Mod. Phys. 67, 249 (1995).

[15] D. Rugar, C. S. Yannoni, and J. A. Sidles, Nature (London) 360, 563 (1992).

[16] D. Rugar, O. Zuger, S. Hoen, C. S. Yannoni, H.-M. Vieth, and R. D. Kendrick, Science 264, 1560 (1994).

[17] Z. Zhang, P. C. Hammel, and P. E. Wigen, Appl. Phys. Lett. 68, 2005 (1996).

[18] K. Wago, O. Zuger, R. Kendrick, C. S. Yannoni, and D. Rugar, J. Vac. Sci. Technol. B 14, 1197 (1996).

[19] K. J. Bruland, W. M. Dougherty, J. L. Garbini, J. A. Sidles, and S. H. Chao, Appl. Phys. Lett. 73, 3159 (1998).

[20] B. C. Stipe, H. J. Mamin, T. D. Stowe, T. W. Kenny, and D. Rugar, Phys. Rev. Lett. 86, 2874 (2001).

[21] T. D. Stowe, K. Yasumura, T. W. Kenny, D. Botkin, K. Wago, and D. Rugar, Appl. Phys. Lett. 71, 288 (1997).

[22] O. Zuger and D. Rugar, Appl. Phys. Lett. 63, 2496 (1993).

[23] O. Zuger, S. T. Hoen, C. S. Yannoni, and D. Rugar, J. Appl. Phys. 79, 1881 (1996).

[24] M. Barbic, J. Appl. Phys. 91, 9987 (2002).

[25] M. Barbic and A. Scherer, J. Appl. Phys. 92, 7345 (2002).

[26] C. P. Slichter, *Principles of Magnetic Resonance* (Springer, New York, 1996).

[27] P. Streckeisen, S. Rast, C. Wattinger, E. Mayer, P. Vettiger, Ch. Gerber, and H.-J. Guntherodt, Appl. Phys. A: Mater. Sci. Process. A66, S341 (1998).

[28] C. Petit, A. Taleb, and M. P. Pileni, Adv. Mater. (Weinheim, Ger.) 10, 259 (1998).

[29] S. Sun, C. B. Murray, D. Weller, L. Folks, and A. Moser, Science 287, 1989 (2000).

[30] A. F. Puntes, K. M. Krishnan, and A. P. Alivisatos, Science 291, 2115 (2001).

[31] T. Hyeon, S. S. Lee, J. Park, Y. Chung, and H. B. Na, J. Am. Chem. Soc. 123, 12798 (2001).

[32] D. R. Baselt, G. U. Lee, K. M. Hansen, L. A. Chrisey, and R. J. Colton, Proc. IEEE 85, 672 (1997).

[33] M. A. Lantz, S. P. Jarvis, and H. Tokumoto, Appl. Phys. Lett. 78, 383 (2001).

[34] T. Ono and M. Esashi, Rev. Sci. Instrum. 74, 5141 (2003).

[35] S. Webb, *From the Watching of Shadows: The Origins of Radiological Tomography* (Adam Hilger, New York, 1990).

[36] W. C. Röntgen, Nature (London) 53, 274 (1896).

[37] J. Radon, Ber. Verh. Saechs. Akad. Wiss. Leipzig, Math.-Naturwiss. Kl. 69, 262 (1917).

[38] R. N. Bracewell, Aust. J. Phys. 9, 198 (1956).

[39] A. Cormack, J. Appl. Phys. 34, 2722 (1963).

[40] G. Hounsfield, Br. J. Radiol. 46, 1016 (1973).

[41] D. J. de Rosier and A. Klug, Nature (London) 217, 130 (1968).

[42] D. E. Kuhl and R. Q. Edwards, Radiology 80, 653 (1963).

[43] G. T. Herman, *Image Reconstruction from Projections* (Academic, New York, 1980).

[44] F. Natterer, *The Mathematics of Computerized Tomography* (Wiley, New York, 1986).

[45] A. C. Kak and M. Slaney, *Principles of Computerized Tomographic Imaging* (SIAM, Philadelphia, 2001).

[46] P. J. McDonald and B. Newling, Rep. Prog. Phys. 61, 1441 (1998).

[47] D. I. Hoult and N. S. Ginsberg, J. Magn. Reson. 148, 182 (2001).

[48] J. A. Sidles, J. L. Garbini, W. M. Dougherty, and S. H. Chao, Proc. IEEE 91, 799 (2003).

[49] J. D. Hannay, R. W. Chantrell, and D. Rugar, J. Appl. Phys. 87, 6827 (2000).

[50] D. L. Olson, T. L. Peck, A. G. Webb, R. L. Magin, and J. V. Sweedler, Science 270, 1967 (1995).

[51] L. R. Narasimhan, C. K. N. Patel, and M. B. Ketchen, IEEE Trans. Appl. Supercond. 9, 3503 (1999).

[52] G. Boero, P. A. Besse, and R. Popovic, Appl. Phys. Lett. 79, 1498 (2001).

[53] R. D. Black et al., Science 259, 793 (1993).

[54] S. Zhang, S. A. Oliver, N. E. Israeloff, and C. Vittoria, Appl. Phys. Lett. 70, 2756 (1997).

[55] F. Bloch, Phys. Rev. 70, 460 (1946).

[56] R. R. Ernst and W. A. Anderson, Rev. Sci. Instrum. 37, 93 (1966).

[57] J. G. Kempf and J. A. Marohn, Phys. Rev. Lett. 90, 087601 (2003).

[58] E. E. Sigmund and W. P. Halperin, J. Magn. Reson. 163, 99 (2003).

[59] G. Binning, H. Rohrer, C. Gerber, and E. Weibel, Phys. Rev. Lett. 49, 57 (1982).

[60] G. Binning, C. F. Quate, and C. Gerber, Phys. Rev. Lett. 56, 930 (1986).

[61] R. Wiesendanger, H. J. Guntherodt, G. Guntherodt, R. J. Gambino, and R. Ruf, Phys. Rev. Lett. 65, 247 (1990).

[62] Y. Manassen, R. J. Hamers, J. E. Demuth, and A. J. Castellano, Jr., Phys. Rev. Lett. 62, 2531 (1989).

[63] C. Durkan and M. E. Welland, Appl. Phys. Lett. 80, 458 (2002).

[64] G. Mollenstedt and W. Bayh, *Phys. Bl.* 18, 299 (1962).

[65] R. W. DeBlois, *J. Appl. Phys.* 29, 459 (1958).

[66] J. Sanny and W. G. Clark, *Rev. Sci. Instrum.* 52, 539 (1981).

[67] H. Mahdjour, W. G. Clark, and K. Baberschke, *Rev. Sci. Instrum.* 57, 1100 (1986).

[68] D. L. Olson, T. L. Peck, A. G. Webb, R. L. Magin, J. V. Sweedler, *Science* 270, 1967 (1995).

[69] K. Ohno and T. Murakami, *J. Magn. Reson.* 79, 343 (1988).

[70] D. A. Seeber, J. H. Hoftiezer, W. B. Daniel, M. A. Rutgers, and C. H. Pennington, *Rev. Sci. Instrum.* 71, 4263 (2000).

[71] L. Ciobanu, D. A. Seeber and C. H. Pennington, *J. Magn. Reson.* 158, 178 (2002).

[72] M. Barbic, J. J. Mock, A. P. Gray, and S. Schultz, *Appl. Phys. Lett.* 79, 1399 (2001).

[73] M. Barbic, J. J. Mock, A. P. Gray, and S. Schultz, *Appl. Phys. Lett.* 79, 1897 (2001).

[74] M. Barbic, *J. Magn. Mag. Mater.* 249, 357 (2002).

[75] M. Todorovic and S. Schultz, *Appl. Phys. Lett.* 73, 3539 (1998).

[76] J. A. Rogers, R. J. Jackman, G. M. Whitesides, D. L. Olson, and J. V. Sweedler, *Appl. Phys. Lett.* 70, 2464 (1997).

[77] Y. J. Kim and M. G. Allen, *IEEE Trans. Compon. Pack. Manuf. C* 21, 26 (1998).

[78] G. Boero, J. Founchi, B. Furrer, P.-A. Besse, and R. S. Popovic, Rev. Sci. Instrum. 72, 2764 (2001).

[79] M. M. Midzor, P. E. Wigen, D. Pelekhov, W. Chen, P. C. Hammel, and M. L. Roukes *J. Appl. Phys.* 87, 6493 (2000).

[80] H. J. Mamin and D. Rugar, *Appl. Phys. Lett.* 79, 3358 (2001).

[81] H. J. Mamin, R. Budakian, and D. Rugar *Rev. Sci. Instrum.* 74, 2749 (2003).

[82] C. Ascoli, P. Baschieri, C. Frediani, L. Lenci, M. Martinelli, G. Alzetta, R. M. Celli, and L. Pardi, *Appl. Phys. Lett.* 69, 3920 (1996).

[83] M. Lohndorf, J. Moreland, and P. Kabos *Appl. Phys. Lett.* 76, 1176 (2000).

[84] J. Moreland, M. Lohndorf, P. Kabos, R. D. McMichael *Rev. Sci. Instrum.* 71, 3099 (2000).

[85] A. Jander, J. Moreland, and P. Kabos *Appl. Phys. Lett.* 78, 2348 (2001).

[86] A. G. Webb, Prog. Nucl. Magn. Reson. Spectrosc. 31, 1 (1997).

[87] Ya. S. Greenberg, *Rev. Mod. Phys.* 70, 175 (1998).

[88] H. Bergh and E. W. McFarland *Meas. Sci. Technol.* 7, 1019 (1996).

[89] A. Suter, D. V. Pelekhov, M. L. Roukes, and P. C. Hammel *J. Magn. Reson.* 154, 210 (2002).

CONCLUSION

This concludes the description of the preferred embodiment of the invention. One or more embodiments of the invention provide a technique of two-dimensional tomographic magnetic resonance imaging using ferromagnetic probes that is distinctly different from other scanning probe techniques that achieve surface atomic resolution imaging, such as scanning tunneling microscopy [59], atomic force microscopy [60], spin polarized tunneling microscopy [61], and spin resonance tunneling microscopy [62][63].

In prior art methods, the images are obtained by raster scanning an atomically sharp probe over a two-dimensional surface of the sample, and at each pixel of the image a measured parameter such as a tunneling current or atomic force is displayed. In the two-dimensional magnetic resonance tomographic reconstruction microscopy of the invention, the ferromagnetic probe has no physical atomic scale features to directly achieve atomic resolution, but rather provides the magnetic field gradients that are sufficiently large to atomically resolve magnetic resonance of individual spins along only one direction.

Embodiments of the invention do not rely on a point-by-point data acquisition for two-dimensional imaging, but rather is conducted by sequential angular rotation of the sample with respect to the ferromagnetic probe and external field around a prescribed axis. At a single angular orientation and magnetic field value many magnetically resonant spins of the sample are detected simultaneously. However, by recording such a multispin signal at many angular orientations and magnetic field values, it is possible to reconstruct the two-dimensional image representation using the methods of computerized tomography.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for conducting magnetic resonance tomographic microscopy comprising:

placing a non-crystalline sample under the influence of a static polarizing first magnetic field;

introducing a radio-frequency field perpendicular to the first magnetic field;

obtaining two or more magnetically resonant spins of the sample simultaneously by sequentially angularly rotating, around a prescribed axis, the sample with respect to a ferromagnetic sphere having a second spatially dependant magnetic field; and reconstructing an image of the sample based on a signal obtained from the magnetically resonant spins using computerized tomography.

2. The method of claim 1, wherein the sample comprises a small molecule, protein, cell or other biological material of interest.

3. The method of claim 1, wherein the sample is about $\frac{1}{10}^{th}$ a size of the ferromagnetic sphere.

4. The method of claim 1, wherein the reconstructing is performed by a Fourier transform filtered backprojection algorithm for parallel projections of the magnetic resonance spins from the ferromagnetic sphere through the sample.

5. The method of claim 4, wherein the reconstructing is performed by a Fourier transform of a radon transform, multiplication by a ramp function |k| in conjugate space, followed by an inverse transformation, and integration over all angles in accordance with:

$$\rho(y,z) = \int_0^\pi \left\{ \int_{-\infty}^{+\infty} \left[ \int_{-\infty}^{+\infty} P_\phi(q) \cdot e^{i2\pi kq} \, dq \right] |k| e^{-i2\pi kq} \, dk \right\} d\phi$$

where $\phi$ is the angle between the sample and ferromagnetic sphere and q is the prescribed axis.

6. The method of claim 4, further comprising correcting for nonlinear projection distortion prior to a first step in the Fourier transform filtered backprojection alogrithm.

7. The method of claim 4, further comprising:
deconvolving each projection from a Lorentzian line shape prior to performing the Fourier transform filtered backprojection; and
performing a linearization prior to performing the Fourier transform filtered backprojection.

8. The method of claim 1, wherein the sample is placed with respect to the ferromagnetic sphere wherein contours of the second magnetic field from the ferromagnetic sphere are perpendicular to the sample, but vary slightly in an intersecting radius of curvature.

9. An system for conducting magnetic resonance tomographic microscopy comprising:
a static polarizing first magnetic field;
a non-crystalline sample under an influence of the first magnetic field;
a radio-frequency field perpendicular to the first magnetic field;
a ferromagnetic sphere having a second spatially dependent magnetic field, wherein two or more magnetically resonant spins of the sample are simultaneously obtained by sequentially angularly rotating, around a prescribed axis, the sample with respect to the ferromagnetic sphere; and
a computer configured to reconstruct an image of the sample based on the obtained magnetically resonant spins using computerized tomography.

10. The system of claim 9, wherein the sample comprises a small molecule, protein, cell, or other biological material of interest.

11. The system of claim 9, wherein the sample is about $\frac{1}{10}^{th}$ a size of the ferromagnetic sphere.

12. The system of claim 9, wherein the computer is configured to reconstruct the image using a Fourier transform filtered backprojection algorithm for parallel projections of the magnetic resonance spins from the ferromagnetic sphere through the sample.

13. The system of claim 12, wherein the computer is configured to reconstruct the image using a Fourier transform of a radon transform, multiplication by a ramp function |k| in conjugate space, followed by an inverse transformation, and integration over all angles in accordance with:

$$\rho(y,z) = \int_0^\pi \left\{ \int_{-\infty}^{+\infty} \left[ \int_{-\infty}^{+\infty} P_\phi(q) \cdot e^{i2\pi kq} \, dq \right] |k| e^{-i2\pi kq} \, dk \right\} d\phi$$

where $\phi$ is the angle between the sample and ferromagnetic sphere and q is the prescribed axis.

14. The system of claim 12, wherein the computer is further configured to reconstruct the image by correcting for nonlinear projection distortion prior to a first step in the Fourier transform filtered backprojection alogrithm.

15. The system of claim 12, wherein the computer is further configured to reconstruct the image by:
deconvolving each projection from a Lorentzian line shape prior to performing the Fourier transform filtered backprojection; and
performing a linearization prior to performing the Fourier transform filtered backprojection.

16. The system of claim 9, wherein the sample is placed with respect to the ferromagnetic sphere wherein contours of the second magnetic field from the ferromagnetic sphere are perpendicular to the sample, but vary slightly in an intersecting radius of curvature.

17. The method of claim 1 wherein the second magnetic field has an azimuthally symmetric dipolar form of:

$$\vec{B}(\vec{r}) = \frac{3\vec{n}(\vec{m} \cdot \vec{n}) - \vec{m}}{|\vec{r}|^3}$$

where n is a unit vector that points from a center of the ferromagnetic sphere to a location of the non-crystalline sample and m is a magnetic moment vector of the sphere.

18. The system of claim 9 wherein the second magnetic field has an azimuthally symmetric dipolar form of:

$$\vec{B}(\vec{r}) = \frac{3\vec{n}(\vec{m} \cdot \vec{n}) - \vec{m}}{|\vec{r}|^3}$$

where n is a unit vector that points from a center of the ferromagnetic sphere to a location of the non-crystalline sample and m is a magnetic moment vector of the sphere.

19. The method of claim 1 wherein only a z-component of the second magnetic field is included when considering the resonant spins in accordance with:

$$B_z(\vec{r}) = \frac{M_0}{|\vec{r}|^3}(3\cos^2\theta - 1)$$

where $\theta$ is an angle between a z-axis and a distance vector r, and $M_0$ is a magnitude of a saturation magnetic moment of the ferromagnetic sphere.

20. The system of claim 9 wherein only a z-component of the second magnetic field is included when considering the resonant spins in accordance with:

$$B_z(\vec{r}) = \frac{M_0}{|\vec{r}|^3}(3\cos^2\theta - 1)$$

where $\theta$ is an angle between a z-axis and a distance vector r, and $M_0$ is a magnitude of a saturation magnetic moment of the ferromagnetic sphere.

* * * * *